(12) United States Patent
Adachi et al.

(10) Patent No.: US 8,493,006 B2
(45) Date of Patent: Jul. 23, 2013

(54) DRIVE UNIT

(75) Inventors: Yusuke Adachi, Osaka (JP); Hideaki Mukae, Hyogo (JP); Masaru Higashionji, Osaka (JP); Eiichi Nagaoka, Hyogo (JP)

(73) Assignee: Panasonic Corporation, Osaka (JP)

( * ) Notice: Subject to any disclaimer, the term of this patent is extended or adjusted under 35 U.S.C. 154(b) by 549 days.

(21) Appl. No.: 12/701,682

(22) Filed: Feb. 8, 2010

(65) Prior Publication Data

US 2010/0213882 A1 Aug. 26, 2010

(30) Foreign Application Priority Data

Feb. 9, 2009 (JP) ................................. 2009-027879

(51) Int. Cl.
*H01L 41/04* (2006.01)
*H01L 41/00* (2006.01)
*H02K 39/00* (2006.01)

(52) U.S. Cl.
USPC ...... 318/116; 310/111; 310/323.06; 310/333; 310/335; 310/346

(58) Field of Classification Search
USPC .................... 318/116; 310/111, 323.06, 333, 310/335, 346
See application file for complete search history.

(56) References Cited

U.S. PATENT DOCUMENTS

| 5,777,444 A | 7/1998 | Motegi |
| 5,869,917 A * | 2/1999 | Ashizawa ...................... 310/333 |
| 7,119,475 B2 * | 10/2006 | Matsuzaki et al. ....... 310/316.01 |
| 7,211,929 B2 * | 5/2007 | Ganor et al. ................... 310/317 |
| 7,321,182 B2 * | 1/2008 | Kataoka ................... 310/323.02 |
| 7,898,146 B2 * | 3/2011 | Higashionji et al. .......... 310/315 |
| 2006/0273689 A1 * | 12/2006 | Kataoka ................... 310/323.06 |

FOREIGN PATENT DOCUMENTS

| JP | 62-210871 | 9/1987 |
| JP | 01-148082 | 6/1989 |
| JP | 03-212179 | 9/1991 |
| JP | 4-331484 | 11/1992 |
| JP | 6-70558 | 3/1994 |
| JP | 09-205785 | 8/1997 |
| JP | 10-174464 | 6/1998 |
| JP | 2004-56914 | 2/2004 |
| JP | 2008-193874 | 8/2008 |

* cited by examiner

*Primary Examiner* — Eduardo Colon Santana
*Assistant Examiner* — Gabriel Agared
(74) *Attorney, Agent, or Firm* — Renner, Otto, Boisselle & Sklar, LLP

(57) ABSTRACT

A drive unit includes an ultrasonic actuator having an actuator body formed using a piezoelectric element, and a driving element provided on the actuator body and configured to output a driving force by moving according to the vibration of the actuator body, and a control section configured to induce the vibration in the actuator body by applying a first and a second AC voltages having a same frequency and different phases to the piezoelectric element. The control section adjusts the first AC voltage and the second AC voltage so that the first AC voltage and the second AC voltage have different voltage values from each other.

12 Claims, 16 Drawing Sheets

DRIVE UNIT

CROSS-REFERENCE TO RELATED APPLICATION

This application claims priority to Japanese Patent Application No. 2009-027879 filed on Feb. 9, 2009, the disclosure of which including the specification, the drawings, and the claims is hereby incorporated by reference in its entirety.

BACKGROUND

1. Technical Field

The technology disclosed herein relates to a drive unit including a vibratory actuator having an actuator body and driver elements.

2. Background Art

Drive units including vibratory actuators for use in various electric devices have been conventionally known (e.g., Japanese Patent Publication No. 2008-193874).

A vibratory actuator associated with a drive unit described in Japanese Patent Publication No. 2008-193874 includes an actuator body configured with a piezoelectric element, and a driver element provided on the actuator body is disposed so as to contact a rotor, which is a movable element. This drive unit induces vibration in the actuator body by applying two alternating current (AC) voltages having a same frequency and different phases to the piezoelectric element in the actuator body, thereby causing the driver element to move accordingly. In doing so, a driving force is transmitted from the driver element to the rotor, and thus the rotor is driven in a predetermined direction. In this regard, the drive unit controls the rotation speed of the rotor by adjusting the phase difference between the two AC voltages depending on the deviation between a target and an actual rotation speeds of the rotor.

SUMMARY

However, since a piezoelectric element has a piezoelectric effect, the input voltage of one channel and the input voltage of the other channel have interaction with each other. In addition, the ratio in the interaction may be non-uniform due to asymmetry introduced in a manufacturing process of elements and due to asymmetry of distribution of pressure applied to an element in driving operation. In such a case, the amounts of currents which flow may differ from each other depending on the frequencies or the phase difference of the two AC voltages even if same AC voltages are applied, which may cause a current exceeding the scope of the assumption to flow, thus the power consumption may increase.

The technology disclosed herein has been developed in view of the foregoing, and it is an object of the technology to provide a drive unit with low power consumption.

A drive unit disclosed herein includes a vibratory actuator having an actuator body formed using a piezoelectric element, and configured to output a driving force by inducing vibration in the actuator body, and a control section configured to induce the vibration in the actuator body by applying a first and a second AC voltages having a same frequency and different phases to the piezoelectric element, where the control section adjusts the first AC voltage and the second AC voltage so that the first AC voltage and the second AC voltage have different voltage values from each other.

According to the drive unit, the voltage values of the two AC voltages applied to the actuator body can be different from each other rather than constantly coincident, and thus the voltage value of either of the AC voltages can be adjusted depending on an operational condition, thereby allowing a reduction of the power consumption.

BRIEF DESCRIPTION OF THE DRAWINGS

FIG. 11A shows the drive voltages, and FIG. 11B shows the currents.

FIG. 12A shows the drive voltages, and FIG. 12B shows the currents.

FIG. 13A shows the drive voltages, and FIG. 13B shows the currents.

FIG. 14A shows the drive voltages, and FIG. 14B shows the currents.

FIG. 15A shows the drive voltages, and FIG. 15B shows the currents.

FIG. 16A shows the drive voltages, and FIG. 16B shows the currents.

FIG. 17A shows the drive voltages, and FIG. 17B shows the currents.

FIG. 18A shows a case before adjustment, and FIG. 18B shows a case after adjusting a duty cycle.

DETAILED DESCRIPTION

Example embodiments of the present invention will be described below in detail with reference to the drawings.

Figure 1:
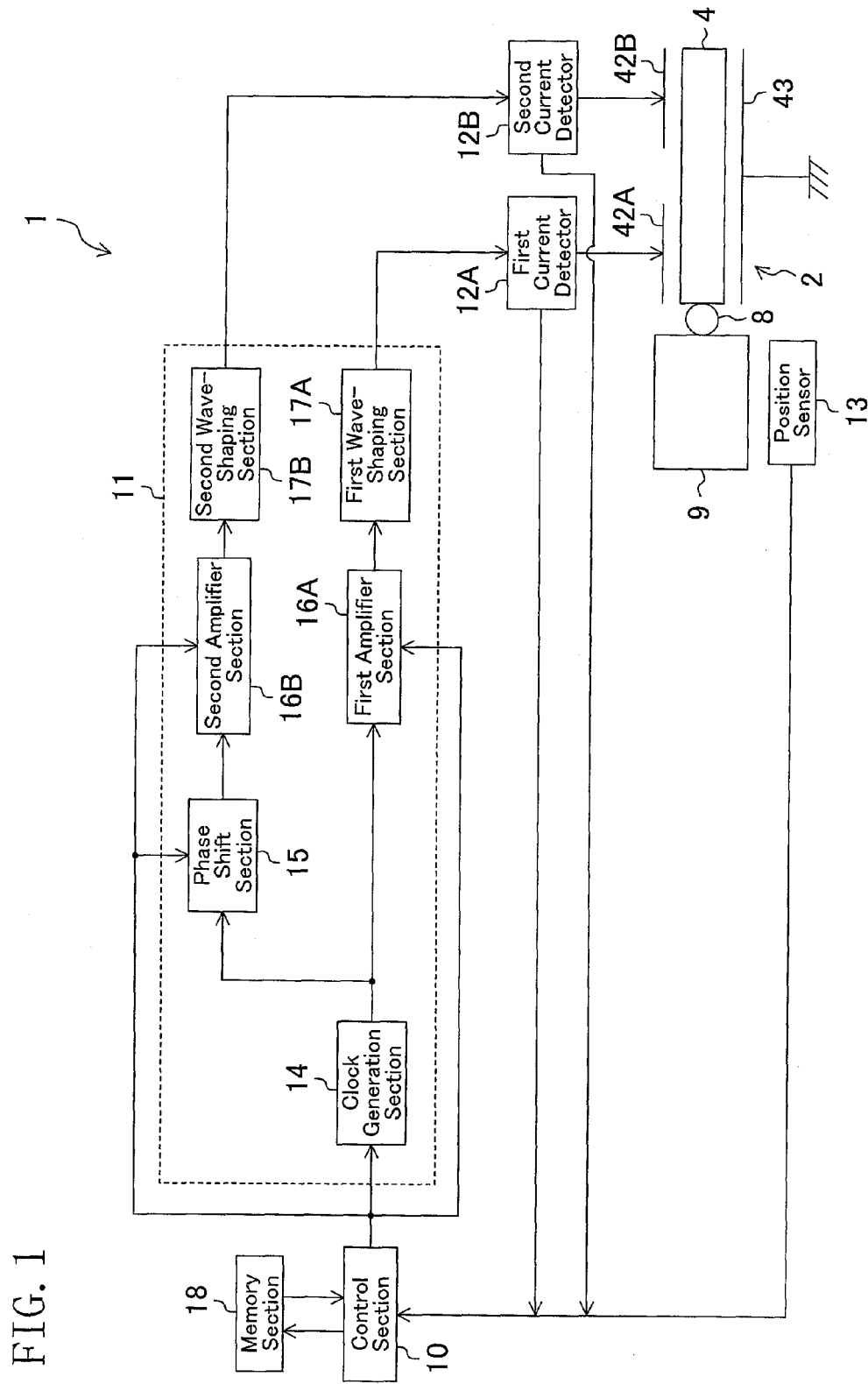
FIG. 1 is a block diagram illustrating a drive unit according to an embodiment of the present disclosure.
Figure 2:
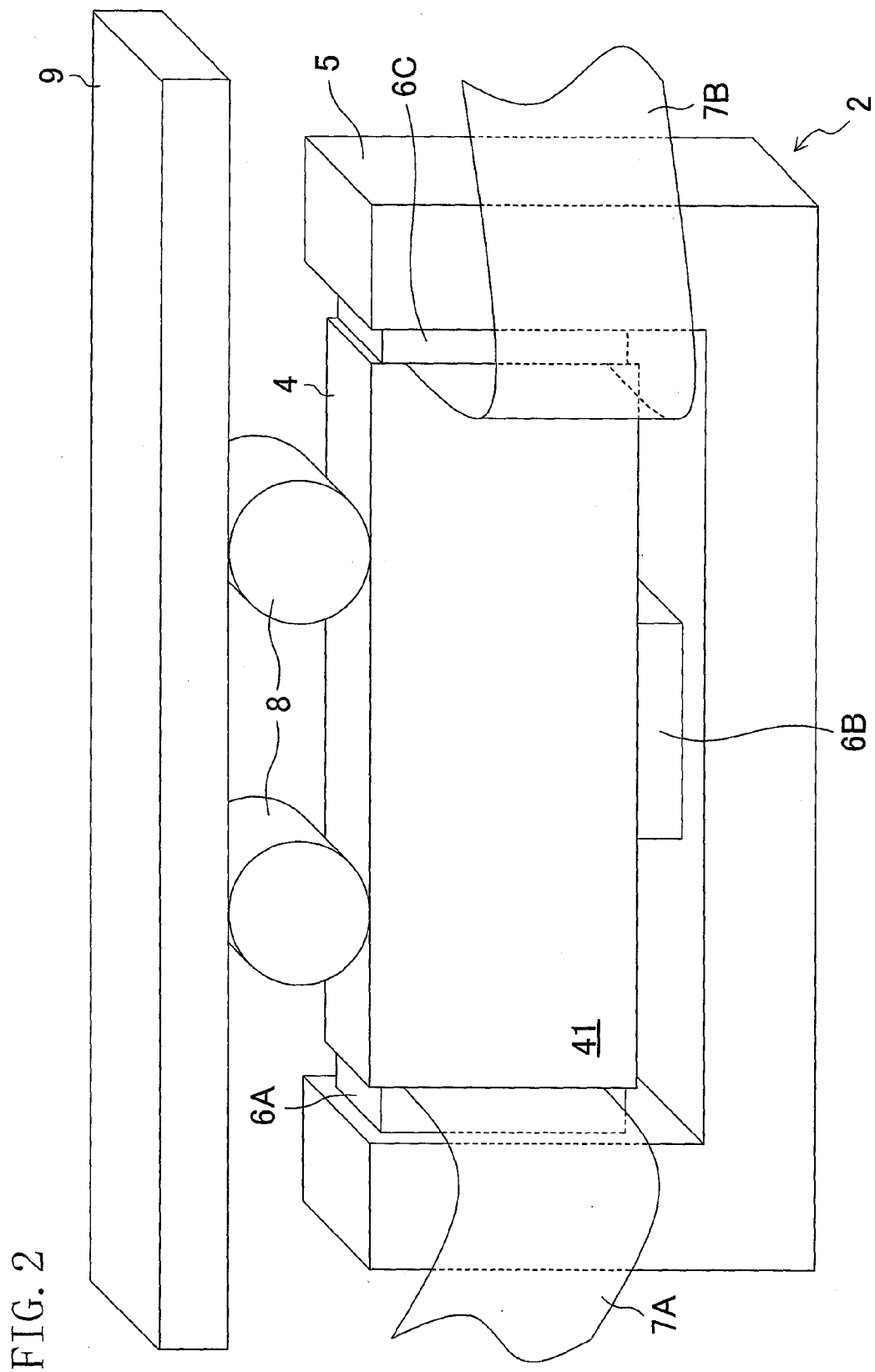
FIG. 2 is a perspective view of the drive unit.

FIG. 1 is a block diagram of a drive unit according to this embodiment, and FIG. 2 is a schematic perspective view of the drive unit. The drive unit 1 according to this embodiment includes an ultrasonic actuator 2, a movable body 9 which is driven by the ultrasonic actuator 2 in a predetermined movable direction, a drive power supply 11 which applies a voltage to the ultrasonic actuator 2, a first and a second current detectors 12A and 12B which detect current flowing into the ultrasonic actuator 2, a position sensor 13 which detects the position of the movable body 9, and a control section 10 which controls the ultrasonic actuator 2 by controlling the drive power supply 11.

<<1: Configuration of Ultrasonic Actuator>>

<1.1: Overall Configuration>

The ultrasonic actuator 2 according to this embodiment includes an actuator body 4, driver elements 8 provided on the actuator body 4, a case 5 which houses the actuator body 4, support members 6A-6C which support the actuator body 4 with respect to the case 5, and a first and a second flexible cables 7A and 7B for supplying power to the actuator body 4; and the ultrasonic actuator 2 generates a relative driving force with respect to the movable body 9 by inducing stretching vibration and bending vibration in the actuator body 4. This ultrasonic actuator 2 constitutes a vibratory actuator, and the movable body 9 constitutes a driven object.

As shown in FIG. 2, the actuator body 4 is formed of a piezoelectric element having a generally rectangular parallelepiped shape (e.g., 6.0 mm long, 1.7 mm wide, and 2.0 mm thick). The actuator body 4 has a configuration in which piezoelectric element layers and electrode layers are stacked in a direction into the paper of FIG. 2. In FIG. 2, the surface on the front side of the actuator body 4 as viewed into the paper is a principal face of a piezoelectric element layer 41. In the rest of the document, a pair of principal faces facing each other of a piezoelectric element layer 41 are referred to as "principal faces." A pair of surfaces facing each other, orthogonal to the principal faces, and parallel to the long sides of the principal faces are referred to as "longer side faces." A pair of surfaces facing each other, orthogonal to the principal faces, and parallel to the short sides of the principal faces are referred to as "shorter side faces." The principal faces, the longer side faces, and the shorter side faces constitute the external surface of the actuator body 4, and the longer side faces and the shorter side faces constitute the peripheral surface of the actuator body 4. In this embodiment, the principal faces have the largest areas of the principal faces, the longer side faces, and the shorter side faces. In this embodiment, the actuator body 4 constitutes a vibrator.

The actuator body 4 is housed in the case 5, which is a support. The actuator body 4 is supported with respect to the case 5 via three support members 6A, 6B, and 6C. The three support members 6A, 6B, and 6C are all elastic. The support members 6A and 6C are respectively press-fitted between the two shorter side faces and the case 5. In this way, the actuator body 4 is supported by the support members 6A and 6C from the direction along the long sides of the principal faces.

The first and the second flexible cables 7A and 7B are respectively interposed between the two shorter side faces of the actuator body 4 and the support members 6A and 6C.

The driver elements 8 are provided on one of the longer side faces of the actuator body 4, and the driver elements 8 contact the plate-like movable body 9. Specifically, the driver elements 8 are fixed near antinodes of bending vibration of a second-order mode (described later) of the actuator body 4. The driver elements 8 each has a cylindrical shape and makes line contact with the actuator body 4. The driver elements 8 are fixed to the actuator body 4 by adhesive agent. The adhesive agent used is softer than the piezoelectric element layers 41 and the driver elements 8. The softness can be compared in terms of, for example, modulus of elasticity. The driver elements 8 and the part of the movable body 9 which contacts the driver elements 8 are made of, for example, a ceramic material made primarily of zirconia, alumina, and silicon nitride, or a resin material.

The support member 6B is provided between the other one of the longer side faces of the actuator body 4, in other words, the longer side face opposite the longer side face on which the driver elements 8 are provided, and the case 5. The support member 6B is provided in compression in a direction toward the movable body 9 (i.e., the lateral direction of the actuator body 4). The support member 6B presses the actuator body 4 against the movable body 9 by its reaction force. This increases the friction forces between the top portions of the driver elements 8 and the movable body 9, and thus the driving force by vibration of the actuator body 4 is efficiently transmitted to the movable body 9 through the driver elements 8.

<1.2: Actuator Body 4>

The actuator body 4 according to this embodiment has a generally rectangular parallelepiped shape. This actuator body 4 includes a plurality of piezoelectric element layers 41 which are piezoelectric bodies and have generally rectangular shapes, and internal electrode layers respectively interposed between corresponding pairs of the piezoelectric element layers 41. The actuator body 4 has a configuration in which the piezoelectric element layers and the electrode layers are stacked in a direction into the paper of FIG. 2 (also referred to hereinafter as thickness direction).

Figure 3:
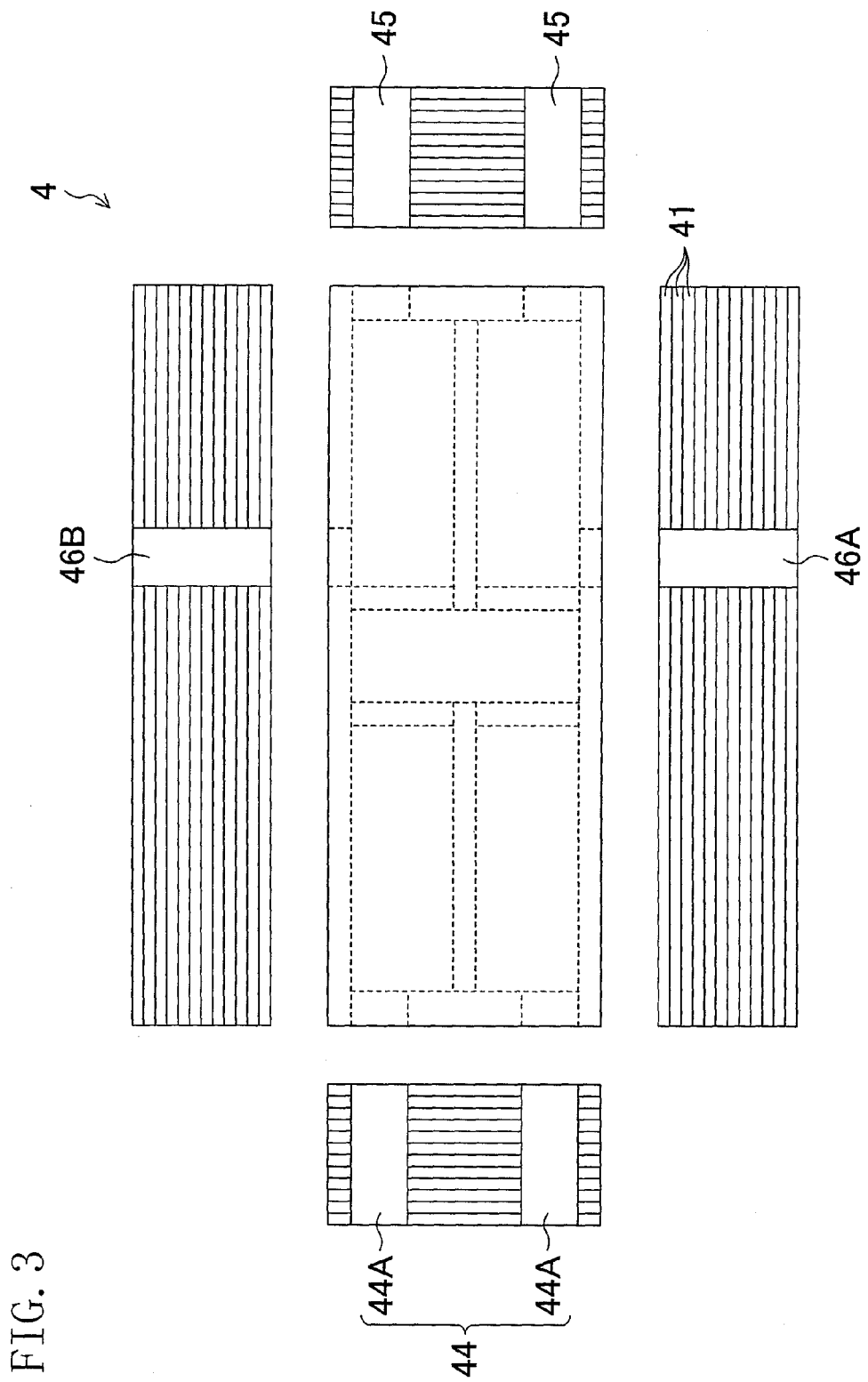
FIG. 3 is a developed view of an actuator body by orthographic projection.

FIG. 3 is a developed view by orthographic projection of the actuator body 4 according to this embodiment. In FIG. 3, the center figure is a figure of a principal face; the figures on the both sides thereof are figures of the shorter side faces; and the figures above and below the figure of a principal face are figures of the longer side faces. Although the internal electrode layers cannot be seen through this principal face, the positions projected onto the principal face are indicated by dashed lines on the principal face. FIGS. 4A-4D are diagrams illustrating respective layers of the actuator body 4 according to this embodiment as viewed in the stacking direction.

As shown in FIG. 4, the actuator body 4 has a generally rectangular parallelepiped shape formed by alternately stacking the piezoelectric element layers 41, which have generally rectangular shapes, and the internal electrode layers. The piezoelectric element layers 41 are insulator layers formed of, for example, a ceramic material such as lead zirconate titanate. The internal electrode layers are formed of power-supply electrodes 42 and counter electrodes 43, which are arranged alternately in the stacking direction (i.e., thickness direction of the actuator body 4) interposing the corresponding piezoelectric element layers 41. The internal electrode layers are electrode layers made of, for example, metal made primarily of silver and palladium, and are provided on the corresponding principal faces of the piezoelectric element layers 41.

As shown in FIG. 3, an external power-supply electrode 44 and external counter electrodes 45 are formed on the shorter side faces of the actuator body 4. More specifically, the external power-supply electrode 44 is a combination of a first and a second external power-supply electrodes 44A and 44B. The first and the second external power-supply electrodes 44A and 44B are provided on one of the two shorter side faces of the actuator body 4. In addition, two external counter electrodes 45 are formed, and both are provided on the other shorter side face. The electrodes 44A, 44B, and 45 are electrically insulated from each other. In other words, the electrodes 44A, 44B, and 45 are not electrically connected together. In addition, a first external connection electrode 46A is provided on one of the longer side faces of the actuator body 4, and a second external connection electrode 46B is provided on the other one of the longer side faces. The first and the second external connection electrodes 46A and 46B are electrically insulated from each other.

Figure 4A:
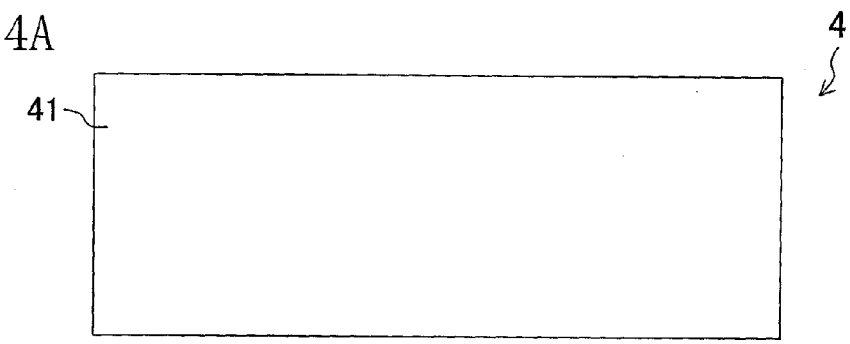
FIGS. 4A-4D are diagrams illustrating respective layers of the actuator body as viewed from the stacking direction.
Figure 4B:
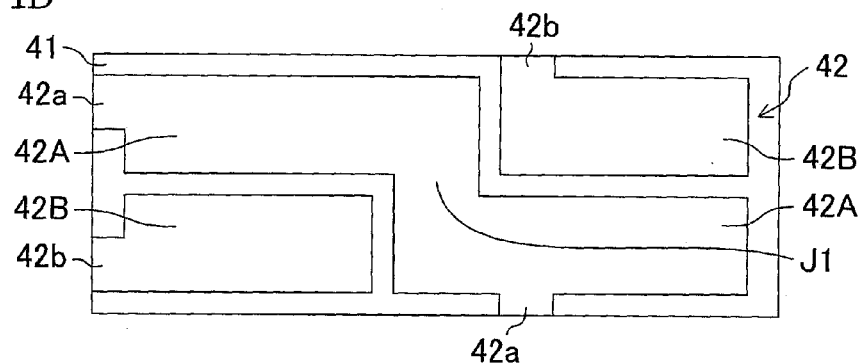
Figure 4C:
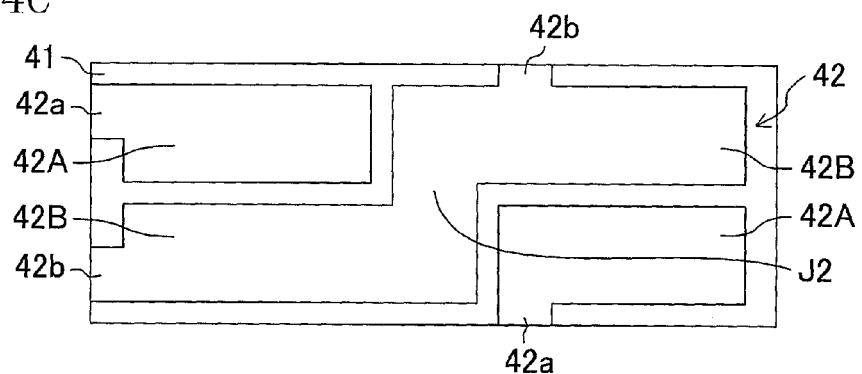

As shown in FIGS. 4B and 4C, the power-supply electrodes 42 are provided on a principal face of at least one piezoelectric element layer 41 of the plurality of the piezoelectric element layers 41. Specifically, a power-supply electrode 42 is provided on a principal face of at least one piezoelectric element layer 41 of the plurality of the piezoelectric element layers 41 in a first pattern as shown in FIG. 4B. In addition, another power-supply electrode 42 is provided on a principal face of a different piezoelectric element layer 41 than the piezoelectric element layer 41 on which the power-supply electrode 42 is provided in the first pattern, in a second pattern different from the first pattern as shown in FIG. 4C.

Specifically, the power-supply electrode 42 formed in the first pattern and the power-supply electrode 42 formed in the second pattern each includes first power-supply electrodes 42A and second power-supply electrodes 42B, which are not electrically connected to the first power-supply electrodes 42A.

Figure 5:
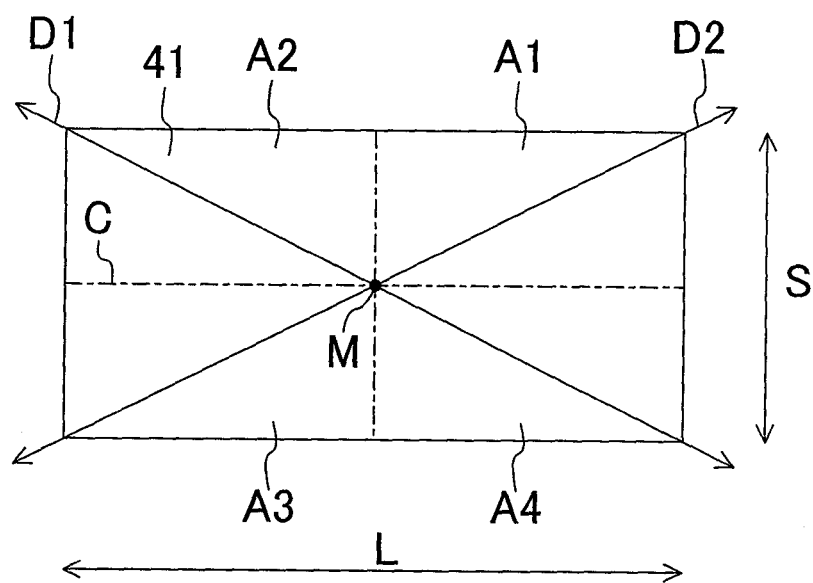
FIG. 5 is a diagram for illustrating four regions on a principal face of the actuator body.

In either pattern of the first and the second patterns, of four regions A1-A4 (see FIG. 5) made by dividing a principal face of a piezoelectric element layer 41 into halves respectively in the longitudinal direction thereof L and in the lateral direction thereof S, the first power-supply electrodes 42A are formed in the two regions A2 and A4 arranged in a first diagonal direction D1 of the principal faces of the piezoelectric element layers 41. In addition, the second power-supply electrodes 42B are formed in the two regions A1 and A3 arranged in a second diagonal direction D2 of the principal faces of the piezoelectric element layers 41, of the four regions A1-A4 (see FIG. 5).

Furthermore, the power-supply electrode 42 in the first pattern includes a first connection electrode J1 extending in the lateral direction in a center portion in the longitudinal direction of the corresponding principal face of the piezoelectric element layer 41. The first power-supply electrodes 42A formed in the two regions A2 and A4 in the first pattern are electrically connected together by the first connection electrode J1. The power-supply electrode in the second pattern includes a second connection electrode J2 extending in the lateral direction in a center portion in the longitudinal direction of the corresponding principal face of the piezoelectric element layer 41. The second power-supply electrodes 42B formed in the two regions A1 and A3 in the second pattern are electrically connected together by the second connection electrode J2.

In addition, in either pattern of the first and the second patterns, a first power-extraction electrode 42a extending to the first external power-supply electrode 44A is provided on the first power-supply electrode 42A formed in the region A2, close to the shorter side face where the first external power-supply electrode 44A is formed, of the first power-supply electrodes 42A formed in the two regions A2 and A4. Thus, the first power-supply electrode 42A in the region A2 is electrically connected to the first external power-supply electrode 44A through the first power-extraction electrode 42a. Meanwhile, another first power-extraction electrode 42a extending to the first external connection electrode 46A formed on a longer side face is provided on the first power-supply electrode 42A formed in the region A4, apart from the shorter side face where the first external power-supply electrode 44A is formed, of the first power-supply electrodes 42A formed in the two regions A2 and A4. In this way, the first power-supply electrodes 42A in the region A4 provided in different piezoelectric element layers 41 are electrically connected together through the first external connection electrode 46A. In addition, since the first power-supply electrode 42A in the region A4 of the first pattern is electrically connected to the first power-supply electrode 42A in the region A2 through the first connection electrode J1, the first power-supply electrode 42A in the region A4 of the second pattern electrically connected to the first power-supply electrode 42A in the region A4 of the first pattern through the first external connection electrode 46A is electrically connected to the first external power-supply electrode 44A through the first connection electrode J1 of the first pattern.

Furthermore, in either pattern of the first and the second patterns, a second power-extraction electrode 42b extending to the second external power-supply electrode 44B is provided on the second power-supply electrode 42B formed in the region A3, close to the shorter side face where the second external power-supply electrode 44B is formed, of the second power-supply electrodes 42B formed in the two regions A1 and A3. Thus, the second power-supply electrode 42B in the region A3 is electrically connected to the second external power-supply electrode 44B through the second power-extraction electrode 42b. Meanwhile, another second power-extraction electrode 42b extending to the second external connection electrode 46B formed on a longer side face is provided on the second power-supply electrode 42B formed in the region A1, apart from the shorter side face where the second external power-supply electrode 44B is formed, of the second power-supply electrodes 42B formed in the two regions A1 and A3. In this way, the second power-supply electrodes 42B in the region A1 provided in different piezoelectric element layers 41 are electrically connected together through the second external connection electrode 46B. In addition, since the second power-supply electrode 42B in the region A1 of the second pattern is electrically connected to the second power-supply electrode 42B in the region A3 through the second connection electrode J2, the second power-supply electrode 42B in the region A1 of the first pattern electrically connected to the second power-supply electrode 42B in the region A1 of the second pattern through the second external connection electrode 46B is electrically connected to the second external power-supply electrode 44B through the second connection electrode J2 of the second pattern.

Figure 4D:
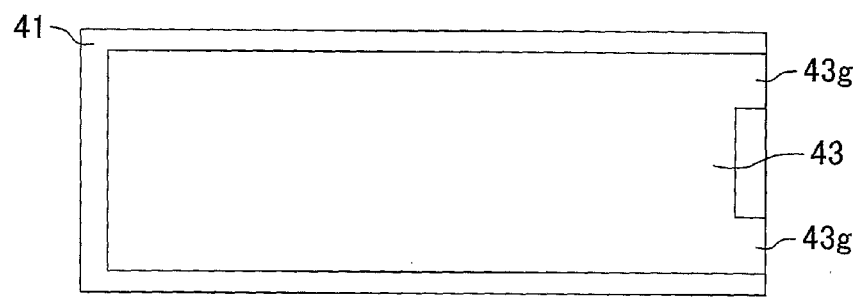

As shown in FIG. 4D, the counter electrodes 43 are each provided over most of the surface of a principal face of the corresponding piezoelectric element layer 41. Specifically, each of the counter electrodes 43 is not formed in a peripheral area of the corresponding piezoelectric element layer 41, but is formed over most of the area inside the peripheral area. The counter electrodes 43 each includes counter extraction electrodes 43g each extending from either end of the short side close to the shorter side face where the external counter electrodes 45 are formed to the external counter electrodes 45, and connected to the external counter electrodes 45. Thus, each of the counter electrodes 43 is electrically connected to the external counter electrodes 45 through the counter extraction electrodes 43g. In addition, the counter electrodes 43 on different piezoelectric element layers 41 are electrically connected together through the counter extraction electrodes 43g and the external counter electrodes 45.

The actuator body 4 is configured by stacking the piezoelectric element layers 41 where the power-supply electrodes 42 or the counter electrodes 43 configured as described above are provided on principal faces. Specifically, a plurality of piezoelectric element layers 41 are stacked in an order of a piezoelectric element layer 41 on which the power-supply electrode 42 in the first pattern is provided, a piezoelectric element layer 41 on which the counter electrode 43 is provided, a piezoelectric element layer 41 on which the power-supply electrode 42 in the second pattern is provided, a piezoelectric element layer 41 on which the counter electrode 43 is provided, a piezoelectric element layer 41 on which the power-supply electrode 42 in the first pattern is provided, a piezoelectric element layer 41 on which the counter electrode 43 is provided . . . . In this regard, the piezoelectric element layers 41 are stacked such that the principal faces on which the power-supply electrodes 42 or the counter electrodes 43 are provided face the same direction, that is, the principal face of one piezoelectric element layer 41 where one of the power-supply electrodes 42 or one of the counter electrodes 43 is provided faces to the principal face of another piezoelectric element layer 41 on which neither the power-supply electrodes 42 nor the counter electrodes 43 are provided. Note that, in order that neither the power-supply electrodes 42 nor the counter electrodes 43 may be exposed to the outside, the piezoelectric element layers 41 on which neither the power-supply electrodes 42 nor the counter electrodes 43 are provided are stacked at the top and/or the bottom of the stack.

As described above, as a result of stacking the piezoelectric element layers 41, the power-supply electrodes 42, and the counter electrodes 43, each of the piezoelectric element layers 41 is interposed between the corresponding power-supply electrode 42 (more specifically, the first and the second power-supply electrodes 42A and 42B) and the corresponding counter electrode 43. That is, the power-supply electrodes 42 and the counter electrodes 43 overlap each other, with the piezoelectric element layers 41 interposed, as viewed in the stacking direction. In this regard, each of the piezoelectric element layers 41 is polarized in a direction from the power-supply electrode 42 to the counter electrode 43.

However, there are areas, in the piezoelectric element layers 41, where the power-supply electrodes 42 and the counter electrodes 43 do not overlap each other as viewed in the stacking direction (see FIG. 3). For example, the first and the second power-extraction electrodes 42a and 42b, and the counter extraction electrodes 43g do not overlap the counter electrodes 43 and the power-supply electrodes 42, respectively, as viewed in the stacking direction. No electric field is created in the portions of the piezoelectric element layers 41 corresponding to such areas. That is, such areas are piezoelectrically inactive areas. Specifically, the power-supply electrodes 42 and the counter electrodes 43 do not overlap each other as viewed in the stacking direction in areas near the shorter side faces of the piezoelectric element layers 41, and thus such areas are piezoelectrically inactive areas.

<1.3: Electrical Connection Members>

In this embodiment, flexible cables are used as electrical connection members. As shown in FIG. 2, the first and the second flexible cables 7A and 7B are electrically connected to the actuator body 4 on the both shorter side faces of the actuator body 4. The first and the second flexible cables 7A and 7B have a same shape.

Figure 6:
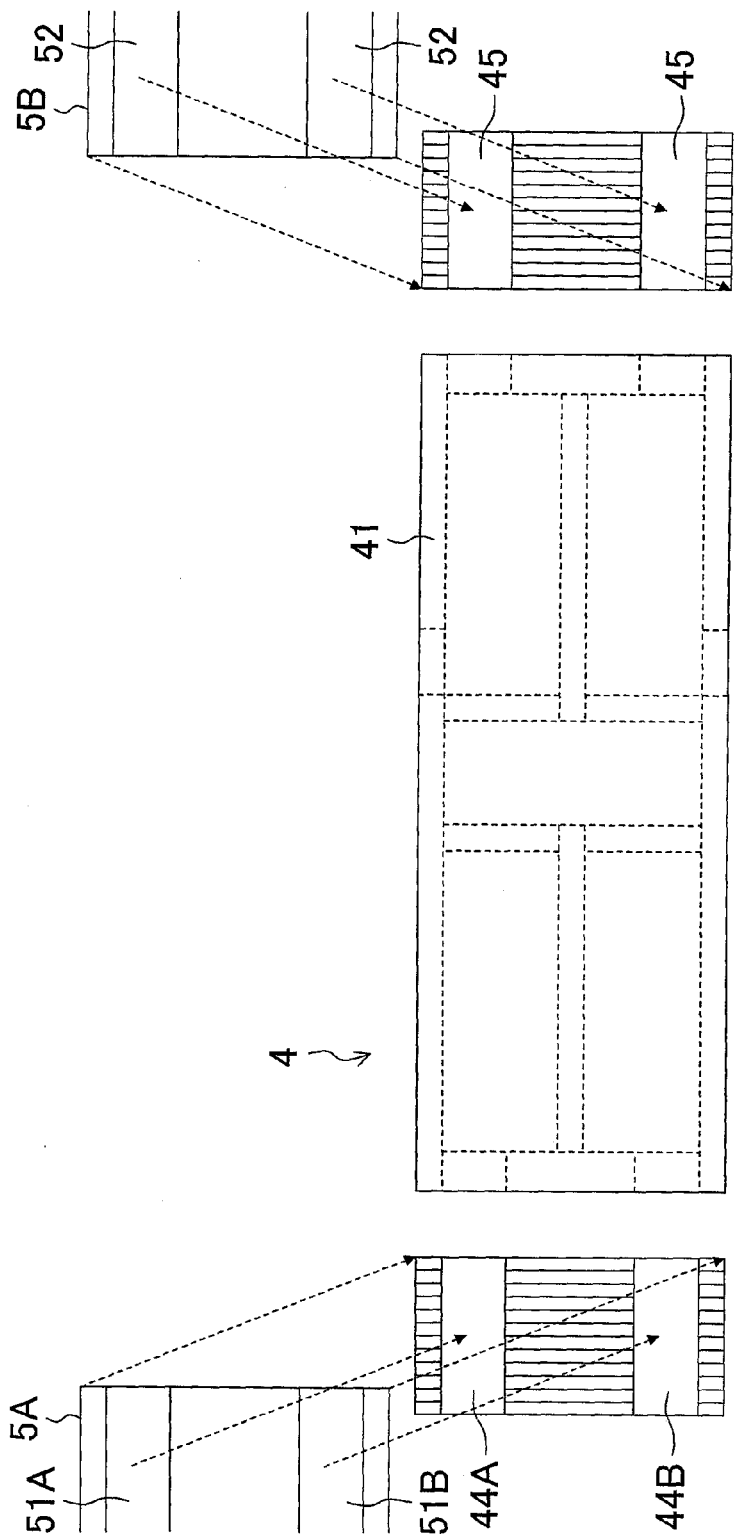
FIG. 6 is a diagram illustrating positional relationships of connection between flexible cables and the side faces of the actuator body.

FIG. 6 is a diagram illustrating positional relationships of connection between the first and the second flexible cables 7A and 7B and the side faces of the actuator body 4. As shown in FIG. 6, the first and the second flexible cables 7A and 7B include an insulative resin substrate and a plurality of electric wires formed by printing copper on the resin substrate. The electric wires are electrically insulated from each other.

The first flexible cable 7A is connected to one of the shorter side faces of the actuator body 4. The first flexible cable 7A includes an electric wire 51A connected to the first external power-supply electrode 44A, and an electric wire 51B connected to the second external power-supply electrode 44B.

Meanwhile, the second flexible cable 7B is connected to the other one of the shorter side faces of the actuator body 4. The second flexible cable 7B includes electric wires 52 connected to the external counter electrodes 45.

In addition, the first flexible cable 7A has a shape symmetrical about a plane passing through the midpoint of the short side of the principal face of the piezoelectric element layer 41, and orthogonal to the short side face. Similarly to the first flexible cable 7A, the second flexible cable 7B also has a shape symmetrical about a plane passing through the midpoint of the short side of the principal face of the piezoelectric element layer 41, and orthogonal to the short side face. Moreover, the first and the second flexible cables 7A and 7B have a configuration symmetrical about a plane passing through the midpoint of the long sides of the principal face of the piezoelectric element layer 41, and orthogonal to the principal face.

That is, a connecting portion of the first flexible cable 7A to the actuator body 4 has a shape symmetrical about a plane passing through the midpoint of the short side of the principal face of the piezoelectric element layer 41, and orthogonal to the short side face. Similarly, a connecting portion of the second flexible cable 7B to the actuator body 4 has a shape symmetrical about a plane passing through the midpoint of the short side of the principal face of the piezoelectric element layer 41, and orthogonal to the short side face. Moreover, the connecting portion of first flexible cable 7A to the actuator body 4 and the connecting portion of the second flexible cable 7B to the actuator body 4 have a configuration symmetrical about a plane passing through the midpoint of the long sides of the principal face of the piezoelectric element layer 41, and orthogonal to the principal face.

Each of the connecting portions between the first and the second flexible cables 7A and 7B and the actuator body 4 is electrically connected and adhered using an anisotropic conductive adhesive film. The anisotropic conductive adhesive film is made in such a way that conductive particles are dispersed in resin and the resultant resin is molded into the form of a film. In addition, the anisotropic conductive adhesive film is electrically conductive in the adhesion direction, that is, the thickness direction of the film, but is not electrically conductive in the directions within the adhesion plane. This allows the plurality of electrodes provided on each shorter side face of the actuator body 4 to conduct electricity to each of the electric wires of the first or the second flexible cable 7A or 7B, and to be electrically insulated from each other, by one anisotropic conductive adhesive film. The connection procedure is as follows: first, an anisotropic conductive film is interposed between the first or the second flexible cable 7A or 7B made of polyimide and the actuator body 4. Then, the first or the second flexible cable 7A or 7B is pressed towards the actuator body 4 using a heated flat iron. This causes the first or the second flexible cable 7A or 7B and the actuator body 4 to be electrically connected by conductive particles and to be adhered due to the effect of resin of the anisotropic conductive film.

The connecting portions between the first and the second flexible cables 7A and 7B and the actuator body 4 are respectively located between the support members 6A and 6C and the actuator body 4. That is, the first flexible cables 7A is pressed to the actuator body 4 by the support member 6A. The second flexible cable 7B is pressed to the actuator body 4 by the support member 6C.

Note that the electric wire 51A connected to the first external power-supply electrode 44A is an example of a first power-supply conductive member. The electric wire 51B connected to the second external power-supply electrode 44B is an example of a second power-supply conductive member. The electric wires 52 connected to the external counter electrodes 45 are an example of counter conductive members. The first flexible cable 7A is an example of a first electrical connection member. The second flexible cable 7B is an example of a second electrical connection member.

The first and the second flexible cables 7A and 7B are connected to the drive power supply 11 (described later). Applying a drive voltage from the drive power supply 11 through the first and the second flexible cables 7A and 7B to the actuator body 4 causes vibration including stretching vibration and bending vibration in the actuator body 4. Then, the vibration of the actuator body 4 causes the driver elements 8 to move in orbital paths according to the movement of the actuator body 4.

<<2: Configuration of Drive Unit>>

The drive power supply 11 in the drive unit 1 includes a clock generation section 14, a phase shift section 15, a first and a second amplifier sections 16A and 16B, a first and a second wave-shaping sections 17A and 17B, and applies a two-phase sinusoidal drive voltage to the actuator body 4.

The clock generation section 14 outputs a square-wave signal (referred to hereinafter as reference clock signal) having a predetermined reference frequency to the first amplifier section 16A and to the phase shift section 15 according to a control signal from the control section 10. The phase shift section 15 shifts the phase of the reference clock signal according to the control signal from the control section 10, and outputs the phase-shifted signal to the second amplifier section 16B. The first and the second amplifier sections 16A and 16B respectively amplify the input reference clock signals to a predetermined voltage and output the amplified signals to the first and the second wave-shaping sections 17A and 17B. The first and the second wave-shaping sections 17A and 17B respectively reshape the signals input from the first and the second amplifier sections 16A and 16B to sinusoidal waves and output the reshaped signals to the actuator body 4 as a first and a second drive voltages. The first drive voltage output from the first wave-shaping section 17A is applied to a portion between the first power-supply electrodes 42A and the counter electrodes 43 of the actuator body 4, and the second drive voltage output from the second wave-shaping section 17B is applied to a portion between the second power-supply electrodes 42B and the counter electrodes 43 of the actuator body 4.

Figure 7:
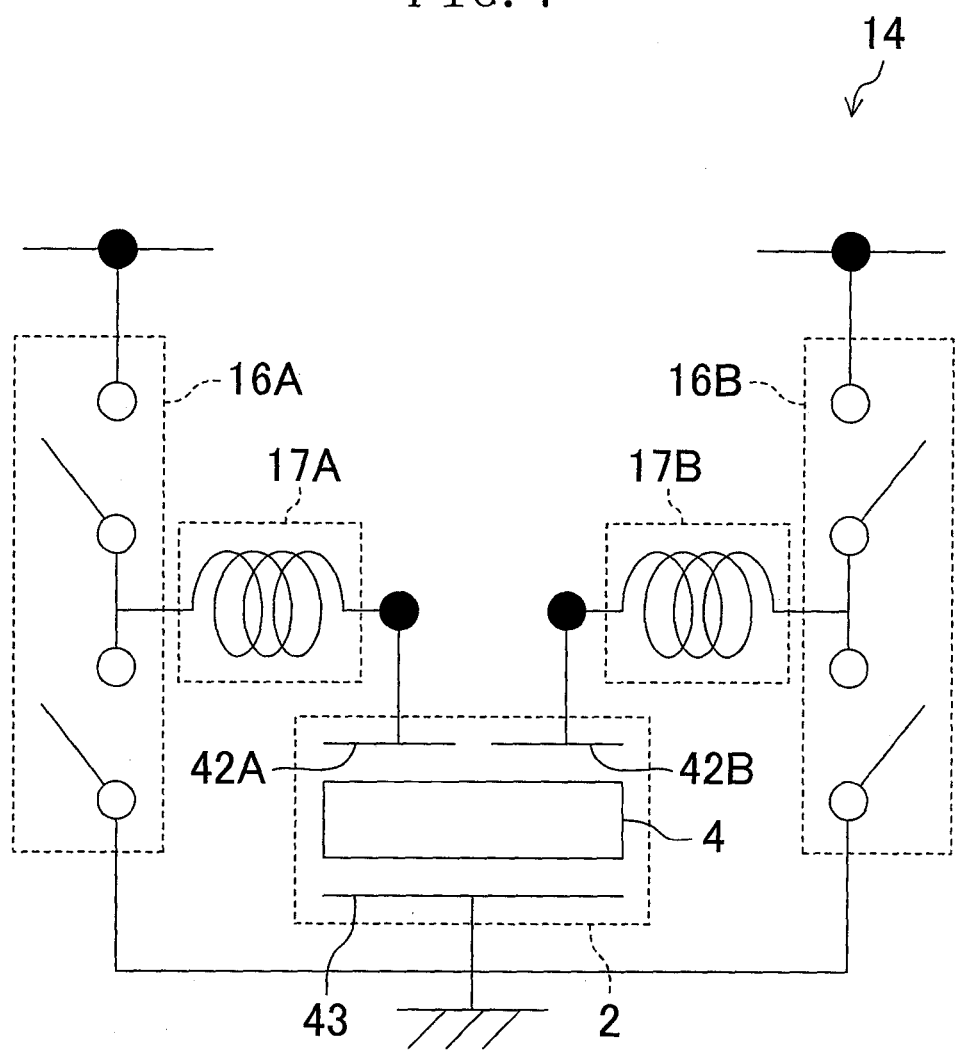
FIG. 7 is a circuit diagram of an ultrasonic actuator and a drive power supply.

FIG. 7 is an equivalent circuit diagram of the ultrasonic actuator 2 and the drive power supply 11. Note that the clock generation section 14 and the phase shift section 15 are omitted.

The first and the second amplifier sections 16A and 16B are each configured by serially connecting a switching element with one end connected to the side of the power-supply voltage and another switching element with one end connected to ground. In this embodiment, an FET is used as a switching element. However, a switching element is not limited to an FET. The first and the second wave-shaping sections 17A and 17B are each formed of a coil. In the first wave-shaping section 17A, one end is connected to a connecting point between the two FETs of the first amplifier section 16A, and the other end is connected to the first power-supply electrodes 42A of the actuator body 4. In the second wave-shaping section 17B, one end is connected to a connecting point between the two FETs of the second amplifier section 16B, and the other end is connected to the second power-supply electrodes 42B of the actuator body 4. Thus, the actuator body 4 is serially connected between the coils and a half bridge.

The first and the second amplifier sections 16A and 16B each outputs a square-wave voltage having a same (maximum) voltage value as the power-supply voltage by switching between on and off states of the two FETs. In addition, a low-pass filter is formed due to the capacity of the actuator body 4 and due to the inductances of the first and the second wave-shaping sections 17A and 17B, and then the square-wave voltages output from the first and the second amplifier sections 16A and 16B are reshaped into sinusoidal drive voltages, which are applied to the actuator body 4. Note that it is preferable that the cut-off frequency of the low-pass filter due to the inductances of the coils and the capacity of the piezoelectric element be higher than the frequency of the drive voltages (also referred to hereinafter as driving frequency) of the actuator body 4.

The drive power supply 11 adjusts the frequencies, phases, and effective values of the first and the second drive voltages by controlling on/off operation timings of the FETs of the first and the second amplifier sections 16A and 16B.

More specifically, the drive power supply 11 outputs the first and the second drive voltages having frequencies associated with the frequency of the reference clock signal by performing on/off operation of the FETs of the first and the second amplifier sections 16A and 16B according to the reference clock signal input from the clock generation section 14. That is, adjusting the frequency of the reference clock signal output from the clock generation section 14 allows the frequencies of the first and the second drive voltages to be adjusted.

In addition, the drive power supply 11 outputs the second drive voltage having a phase shift relative to the first drive voltage by shifting the phase of the reference clock signal input to the second amplifier section 16B relative to that of the reference clock signal input to the first amplifier section 16A by the phase shift section 15, thereby causing on/off operation of the FETs of the second amplifier section 16B to be performed at different times than those of the FETs of the first amplifier section 16A. That is, adjusting the amount of the phase shift performed by the phase shift section 15 allows the phase difference between the first and the second drive voltages to be adjusted.

Furthermore, the drive power supply 11 changes the duty cycles (ratios each of an On time relative to one period) of the square-wave voltages to change the effective values of the first and the second drive voltages by adjusting, in each of the first and the second amplifier sections 16A and 16B, the ratio between a time period during which one FET of the two FETs is turned on and a time period during which the other FET is turned on according to the control signal from the control section 10. That is, adjusting the duty cycle of the square-wave voltage in each of the first and the second amplifier sections 16A and 16B allows each of the effective values of the first and the second drive voltages to be adjusted. Note that, in this embodiment, the drive power supply 11 adjusts the duty cycles of the square-wave voltages in a range of 0%-50%.

Note that, although the description has been presented in terms of a half bridge of two channels generating the first and the second drive voltages, the power supply circuit may be configured with a full bridge of the two channels or an amplifier configuration.

In this regard, the first current detector 12A is serially connected between the first wave-shaping section 17A and the first power-supply electrodes 42A of the actuator body 4. The second current detector 12B is serially connected between the second wave-shaping section 17B and the second power-supply electrodes 42B of the actuator body 4. These first and second power-supply electrodes 42A and 42B are formed of resistors, and detect currents by voltage differences between the both ends. Thus, the first current detector 12A detects a current which flows between the first power-supply electrodes 42A and the counter electrodes 43 of the actuator body 4 depending on the first drive voltage (referred to hereinafter as first current), while the second current detector 12B detects a current which flows between the second power-supply electrodes 42B and the counter electrodes 43 of the actuator body 4 depending on the second drive voltage (referred to hereinafter as second current). However, since the efficiency of the ultrasonic actuator 2 in operation decreases if a resistance value is too high, it is preferred that the resistance values of the first and the second current detectors 12A and 12B be approximately 0.1-100Ω.

Furthermore, the position sensor 13 is disposed near the movable body 9. The position sensor 13 detects the position of the movable body 9, and outputs position information thereof to the control section 10.

<<3: Operation of Drive Unit>>

<3.1: Basic Operation>

Figure 8:
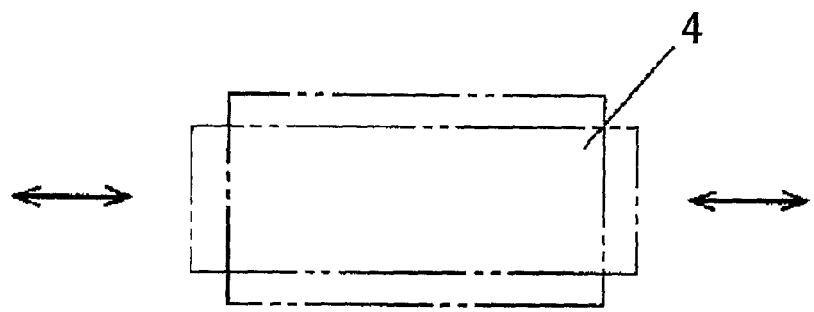
FIG. 8 is a conceptual diagram illustrating a deviation in stretching vibration of a first-order mode of the ultrasonic actuator.
Figure 9:
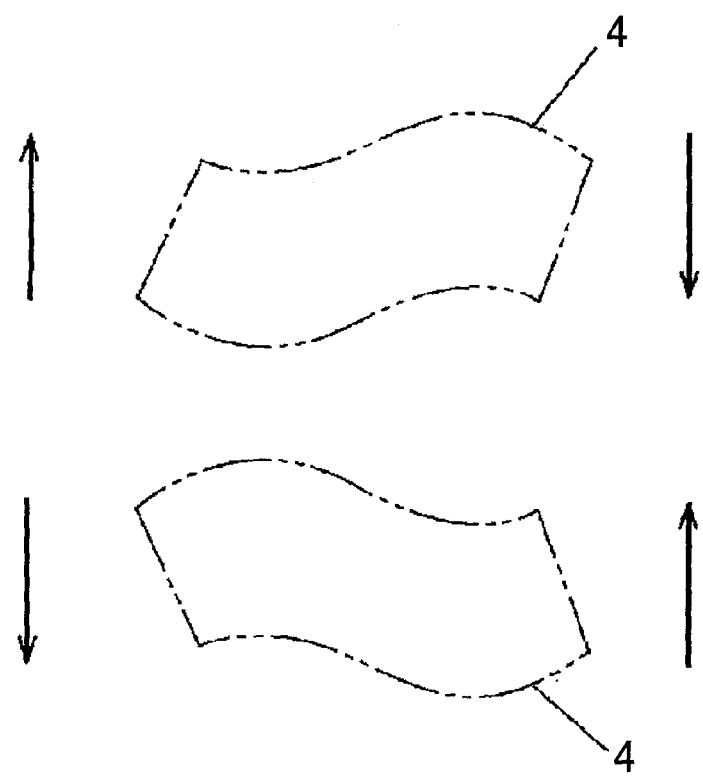
FIG. 9 is a conceptual diagram illustrating deviations in bending vibration of a second-order mode of the ultrasonic actuator.
Figure 10A:
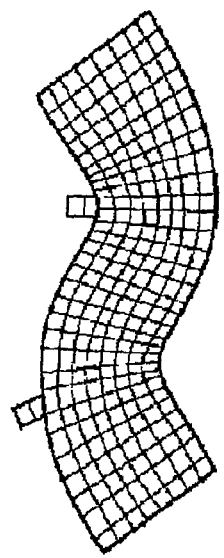
FIGS. 10A-10D are conceptual diagrams illustrating a motion of the ultrasonic actuator.
Figure 10B:
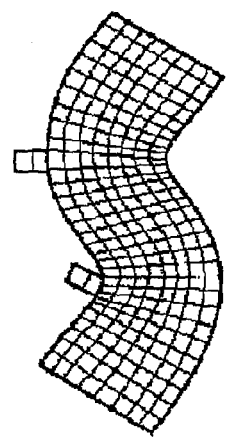
Figure 10C:
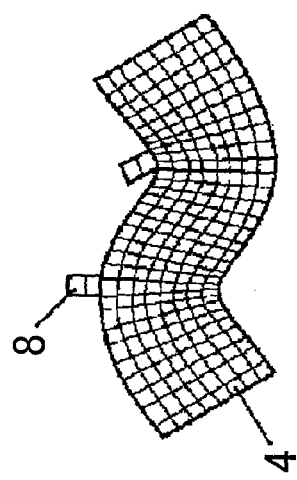
Figure 10D:
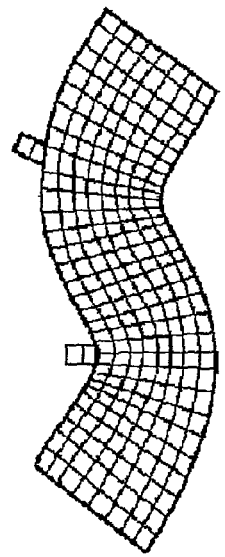

Operation of the ultrasonic actuator 2 will be described below. FIG. 8 is a conceptual diagram illustrating a deviation in stretching vibration of the first order according to this embodiment; FIG. 9 is a conceptual diagram illustrating deviations in bending vibration of the second order; and FIGS. 10A-10D are conceptual diagrams illustrating a motion of the actuator body 4. Note that, in FIGS. 8-9 and 10A-10D, the principal faces of the actuator body 4 are parallel to the paper.

The electric wires 52 of the second flexible cable 7B are connected to ground. The drive power supply 11 applies the first drive voltage of a sinusoidal wave having a predetermined frequency to the first power-supply electrodes 42A on principal faces of the piezoelectric element layers 41 through the electric wire 51A and the first external power-supply electrode 44A, and applies the second drive voltage of a sinusoidal wave having almost the same amplitude and almost the same frequency as those of the first drive voltage to the second power-supply electrodes 42B through the electric wire 51B and the second external power-supply electrode 44B.

Here, if the phase difference between the first and the second drive voltages is 0°, stretching vibration of the first order is induced in the actuator body 4 as shown in FIG. 8. Meanwhile, if the phase difference is 180°, bending vibration of the second order is induced in the actuator body 4 as shown in FIG. 9.

In addition, if the phase difference between the first drive voltage applied to the first power-supply electrodes 42A and the second drive voltage applied to the second power-supply electrodes 42B is approximately 90° or −90°, stretching vibration of the first order and bending vibration of the second order are induced in a coordinated manner in the actuator body 4 as shown in FIGS. 10A-10D. This causes the shape of the actuator body 4 to change and vibrate sequentially as shown in FIGS. 10A-10D, and thus the driver elements 8 provided on the actuator body 4 each moves in an orbital path (specifically, a generally elliptical path) as viewed in the direction into the paper of FIGS. 10A-10D. That is, composite vibration of stretching vibration and bending vibration of the actuator body 4 causes the driver elements 8 to move in elliptical paths. This elliptical movement causes the movable body 9 contacted by the driver elements 8 to move relative to the actuator body 4.

In this regard, the actuator body 4 is arranged such that the longitudinal direction of the principal faces thereof coincides with the movable direction of the movable body 9, and the lateral direction of the principal faces coincides with a direction in which the actuator body 4 is biased toward the movable body 9 by the support member 6B. That is, the expanding/contracting direction of stretching vibration of the actuator body 4 is the movable direction of the movable body 9, and the vibratory direction of bending vibration is the direction in which the driver elements 8 press the movable body 9. Note that, the stacking direction of the actuator body 4 is orthogonal to both the expanding/contracting direction of stretching vibration and the vibratory direction of bending vibration. In addition, the longer side faces of the actuator body 4 are surfaces which intersect the direction of bending vibration (i.e., surfaces facing toward bending vibration).

As described previously, since the direction of stretching vibration of the actuator body 4 is coincident with the movable direction of the movable body 9, a larger amplitude of stretching vibration allows the movable body 9 to be moved over a longer distance. That is, the movable body 9 can be moved faster with a same frequency. Meanwhile, since bending vibration of the actuator body 4 occurs in the direction in which the driver elements 8 press the movable body 9, friction forces between the movable body 9 and the driver elements 8 are affected by bending vibration. That is, if the movable body 9 is to be moved to the right as viewed in FIG. 2, the friction forces between the driver elements 8 and the movable body 9 are made high when the driver elements 8 shift to the right, and the friction forces between the driver elements 8 and the movable body 9 are made low when the driver elements 8 shift to the left.

As such, in this embodiment, the actuator body 4 is formed such that a resonant frequency of bending vibration of the second order is approximately coincident with an anti-resonant frequency of stretching vibration of the first order, and then the driving frequency of the actuator body 4 is set to a frequency near a resonant frequency of bending vibration of the second order.

That is, driving the actuator body 4 at a frequency near a resonant frequency of bending vibration allows the friction forces between the movable body 9 and the driver elements 8 to be increased, and thus the movable body 9 can be moved relatively through the friction forces. In addition, driving the actuator body 4 at a frequency near an anti-resonant frequency of stretching vibration prevents a high current from flowing to the actuator body 4, and thus heat generation in the actuator body 4 can be prevented. Note that, since an impedance of the actuator body 4 at a resonant frequency of bending vibration is not as low as an impedance at a resonant frequency of stretching vibration, there are no problems with a high current flowing to the actuator body 4 at a resonant frequency of bending vibration.

As described previously, the drive unit 1 operates the ultrasonic actuator 2 and moves the movable body 9 to a desired position at a desired speed. Specifically, the drive unit 1 controls the moving speed and the position of the movable body 9 by adjusting the control signal to the drive power supply 11 according to a detect signal from the position sensor 13. For example, the drive unit 1 adjusts the amount of amplitude of the actuator body 4 by changing the reference frequency of the reference clock signal of the clock generation section 14, thereby adjusts the moving speed of the movable body 9. In this regard, since an amplitude change of stretching vibration associated with a change of the driving frequency is more gradual in a frequency range near an anti-resonant frequency than in a frequency range near a resonant frequency, adjustment of the moving speed of the movable body 9 by changing the driving frequency can be stably performed by setting the driving frequency to a frequency near an anti-resonant frequency of stretching vibration as described previously.

Note that speed control can be also performed by control using the voltage value of the drive voltage, or by setting the phase difference between the voltages applied to the first and the second power-supply electrodes to a value other than 90 degrees. In either case, since the speed of the movable body is stabilized for the frequency by setting the driving frequency to a frequency higher than an anti-resonant frequency of stretching vibration, speed control can be stably performed even if a resonant frequency and an anti-resonant frequency of the actuator body 4, the driving frequency, etc., vary.

<3.2: Voltage-Value Control of Drive Voltages>

Voltage-value control of the drive voltages of the drive unit 1 will be described below.

In this embodiment, the drive unit 1 adjusts the voltage values of the first and the second drive voltages applied to the actuator body 4 according to the value of current flowing to the actuator body 4. The control period of this voltage-value control is longer than the control period of position control or speed control of the movable body 9. FIGS. 11A-17B show the first and the second drive voltages and the first and the second currents under various conditions.

Figure 11A:
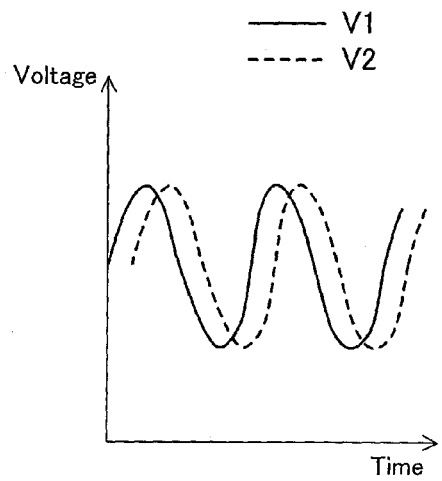
FIGS. 11A-11B are graphs showing a first and a second drive voltages and a first and a second currents corresponding to respective ones when the current values of the first and the second currents are generally the same.
Figure 11B:
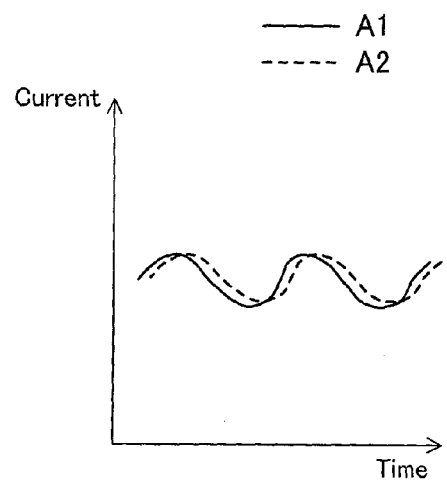
Figure 12A:
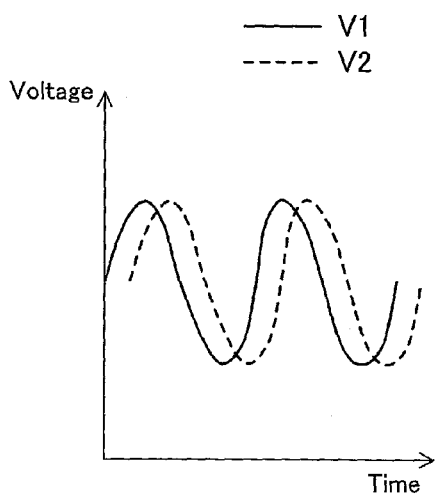
FIGS. 12A-12B are graphs showing a first and a second drive voltages and a first and a second currents corresponding to respective ones when the current values of the first and the second currents are significantly different from each other.
Figure 12B:
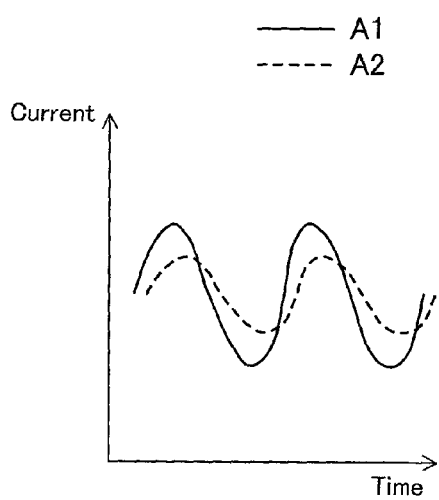

For example, if the first and the second drive voltages V1 and V2 having a same effective value of voltage, a same frequency, and different phases as shown in FIGS. 11A and 12A are applied to a portion between the first power-supply electrodes 42A and the counter electrodes 43 of the actuator body 4 (also referred to hereinafter as first inter-electrode portion) and to a portion between the second power-supply electrodes 42B and the counter electrodes 43 (also referred to hereinafter as second inter-electrode portion), the first and the second currents A1 and A2 which have a same effective value of current, a same frequency, and different phases may flow respectively through the first and the second inter-electrode portions as shown in FIG. 11B, or the first and the second currents A1 and A2 which have a same frequency, different phases, and different effective values of currents may flow as shown in FIG. 12B.

That is, since the actuator body 4 has a piezoelectric effect, the drive voltage applied to one inter-electrode portion and the drive voltage applied to the other inter-electrode portion have interaction with each other. In addition, the ratio in the interaction may be non-uniform due to asymmetry introduced in a manufacturing process of the actuator body 4 and due to asymmetry of distribution of pressure applied to the actuator body 4 in driving operation. Therefore, even if drive voltages having a same effective value are applied to the first and the second power-supply electrodes 42A and 42B, the effective values of the first and the second currents flowing therethrough may differ.

Current Equalization Control

Therefore, the drive unit 1 compares the first current A1 flowing through the first inter-electrode portion with the second current A2 flowing through the second inter-electrode portion based on detection results of the first and the second current detectors 12A and 12B, and adjusts the voltages values of the first and the second drive voltages V1 and V2 so that the difference between the current values of the first and the second currents A1 and A2 is less than or equal to a predetermined threshold. Specifically, in the drive power supply 11, the control section 10 adjusts the duty cycle of a square-wave voltage from which the first and the second drive voltages V1 and V2 originate, thereby adjusts the effective values of the first and the second drive voltages V1 and V2.

Figure 13A:
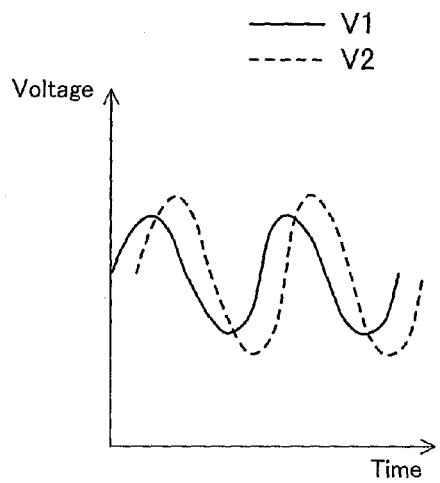
FIGS. 13A-13B are graphs showing a first and a second drive voltages and a first and a second currents corresponding to respective ones when the current values of the first and the second currents are made generally the same by adjusting the first drive voltage to a lower value.
Figure 13B:
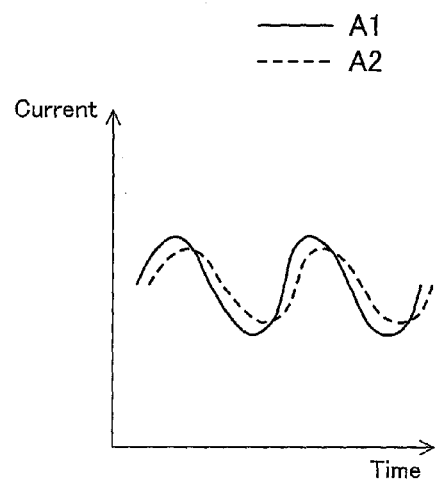
Figure 18A:
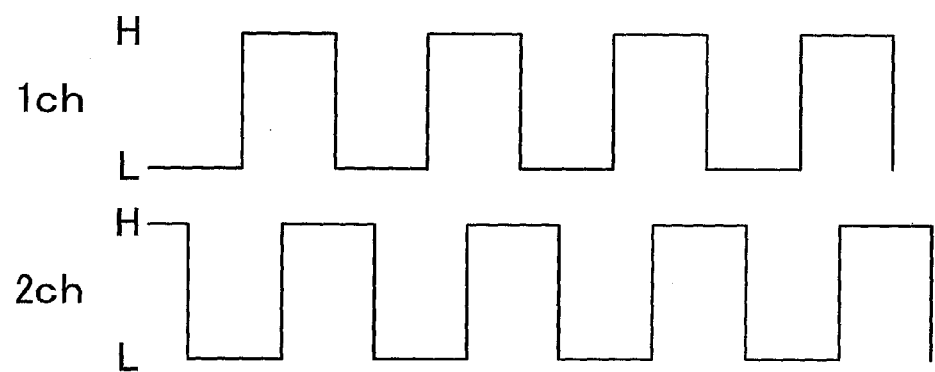
FIGS. 18A-18B are graphs showing square-wave voltages output from a first and a second amplifier sections.
Figure 18B:
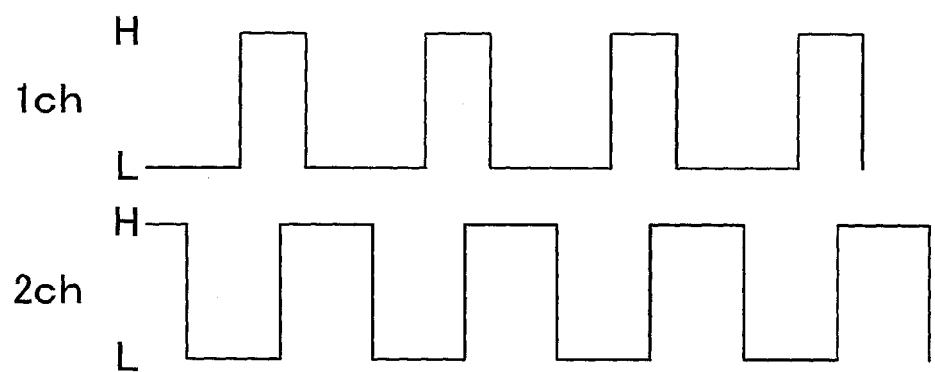

For example, if the effective value of the first current A1 is larger than the effective value of the second current A2 as shown in FIG. 12B, the effective value of the first drive voltage V1 is adjusted to a lower value as shown in FIG. 13A, thereby adjusting the difference between the effective values of the first and the second currents A1 and A2 to less than or equal to a predetermined threshold (see FIG. 13B). Specifically, the square-wave voltages output from the first and the second amplifier sections 16A and 16B are signals having a same amplitude, a same frequency, a same duty cycle, and a phase shift before adjustment as shown in FIG. 18A. Note that, in FIGS. 18A-18B, the signals denoted with "1ch" are the square-wave voltages from the first amplifier section 16A, and the signals denoted with "2ch" are the square-wave voltages from the second amplifier section 16B. If the effective value of the first drive voltage V1 is to be reduced, only the duty cycle of the square-wave voltage is reduced while the amplitude, the frequency, and the phase difference thereof are kept unchanged as shown in FIG. 18B. In doing so, the effective value of the first drive voltage V1 can be reduced.

Figure 14A:
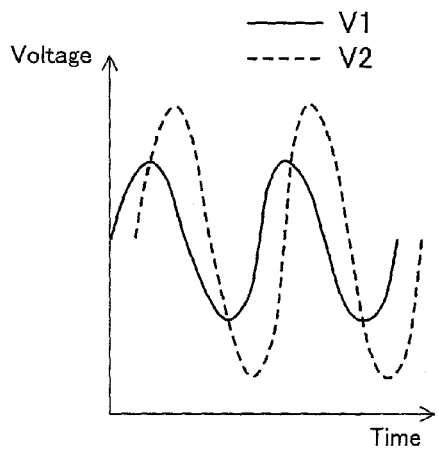
FIGS. 14A-14B are graphs showing a first and a second drive voltages and a first and a second currents corresponding to respective ones when the current values of the first and the second currents are made generally the same by adjusting the second drive voltage to a higher value.
Figure 14B:
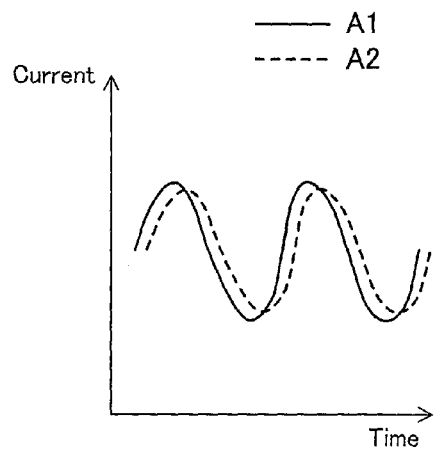

Alternatively, the effective value of the second drive voltage V2 is adjusted to a higher value as shown in FIG. 14A, thereby adjusting the difference between the effective values of the first and the second currents A1 and A2 to less than or equal to a predetermined threshold (see FIG. 14B). In this regard, the difference between the effective values of the first and the second currents A1 and A2 may be adjusted to less than or equal to a predetermined threshold by adjusting the effective value of the first drive voltage V1 to a lower value and the effective value of the second drive voltage V2 to a higher value.

In doing so, even if a difference arises between the first and the second currents A1 and A2, equalization of the first and the second currents A1 and A2 can be pursued, thereby preventing a higher current than expected from flowing to the actuator body 4. As a result, heat generation in the actuator body 4 can be reduced, and the power consumption can also be reduced.

Current Limitation Control

In addition, the drive unit 1 may be configured such that equalization of the first and the second currents is not performed, but instead the first and the second drive voltages V1 and V2 are controlled so that neither the first nor the second current exceeds a predetermined upper limit. That is, the drive unit 1 adjusts the voltage values of the first and the second drive voltages V1 and V2 so that neither the first nor the second current A1 nor A2 exceeds a predetermined upper limit based on detection results of the first and the second current detectors 12A and 12B. Specifically, in the drive power supply 11, the control section 10 adjusts the duty cycle of a square-wave voltage from which the first and the second drive voltages V1 and V2 originate, thereby adjusts the effective values of the first and the second drive voltages V1 and V2.

Figure 15A:
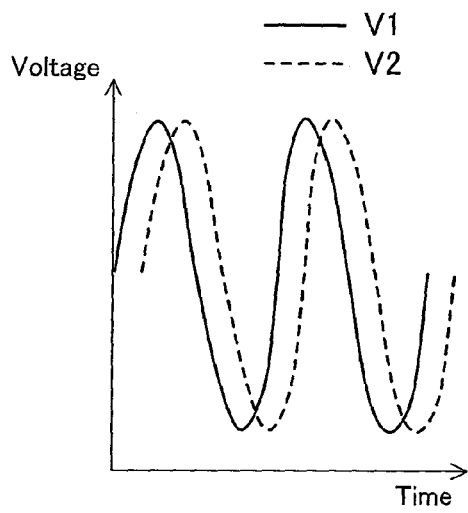
FIGS. 15A-15B are graphs showing a first and a second drive voltages and a first and a second currents corresponding to respective ones when the current value of the first current exceeds an upper limit.
Figure 15B:
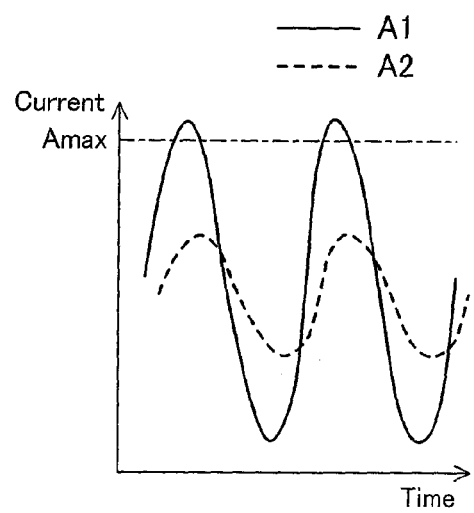
Figure 16A:
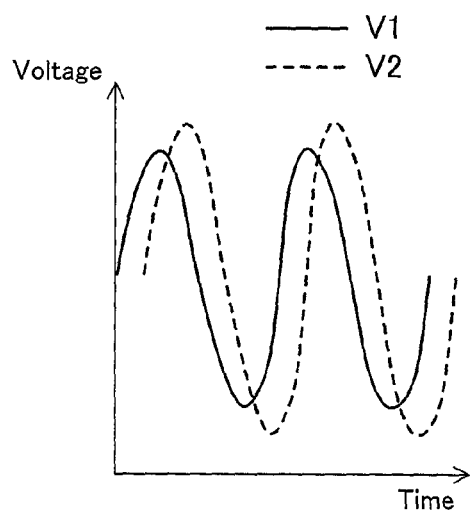
FIGS. 16A-16B are graphs showing a first and a second drive voltages and a first and a second currents corresponding to respective ones when the current value of the first current is adjusted to less than or equal to an upper limit by adjusting the first drive voltage to a lower value.
Figure 16B:
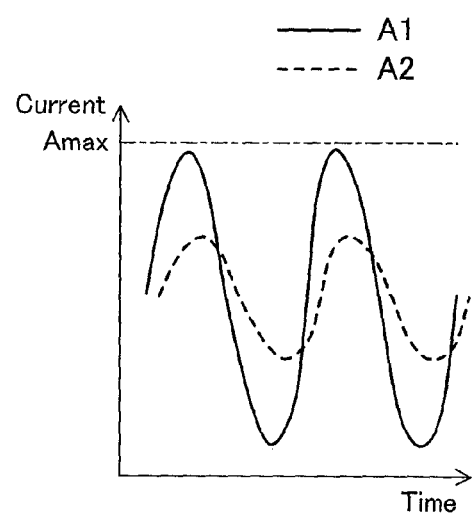

For example, if the peak value of the first current A1 exceeds an upper limit Amax as shown in FIG. 15B when the first and the second drive voltages V1 and V2 having a same effective value of voltage, a same frequency, and different phases as shown in FIG. 15A are applied to the first and the second inter-electrode portions of the actuator body 4, the effective value of the first drive voltage V1 is adjusted to a lower value as shown in FIG. 16A, thereby adjusting the peak value of the first current A1 to less than or equal to the upper limit Amax (see FIG. 16B). Note that, the second drive voltage V2 is adjusted if the peak value of the second current A2 exceeds the upper limit Amax, and both the first and the second drive voltages V1 and V2 are adjusted if both the first and the second currents A1 and A2 exceed the upper limit Amax.

In doing so, the first and the second currents A1 and A2 can be reduced at most to less than or equal to the upper limit Amax, thereby preventing a higher current than expected from flowing to the actuator body 4. As a result, heat generation in the actuator body 4 can be reduced, and the power consumption can also be reduced.

Note that the drive voltages may be adjusted based on whether the effective values of the first and the second currents A1 and A2 exceed an upper limit for the effective values or not, instead of whether the peak values of the first and the second currents A1 and A2 exceed the upper limit Amax or not.

Speed Priority Control

Furthermore, if the driving speed of the movable body 9 has a higher priority than the power consumption, the drive unit 1 adjusts the voltage value of the drive voltage of the first or the second inter-electrode portion, whichever is more electrically conductive, to a higher value based on detection results of the first and the second current detectors 12A and 12B. More specifically, the drive voltage of the inter-electrode portion, of the first and the second inter-electrode portions, through which a higher current value of current flows when the first and the second drive voltages V1 and V2 having a same voltage value are applied is adjusted to a higher value.

Figure 17A:
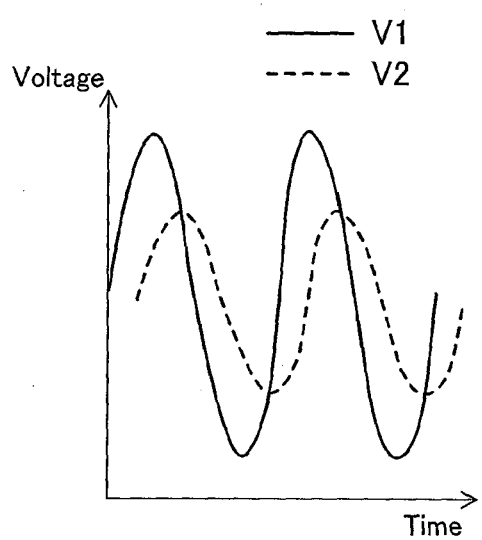
FIGS. 17A-17B are graphs showing a first and a second drive voltages and a first and a second currents corresponding to respective ones when the first drive voltage is adjusted to a higher value.
Figure 17B:
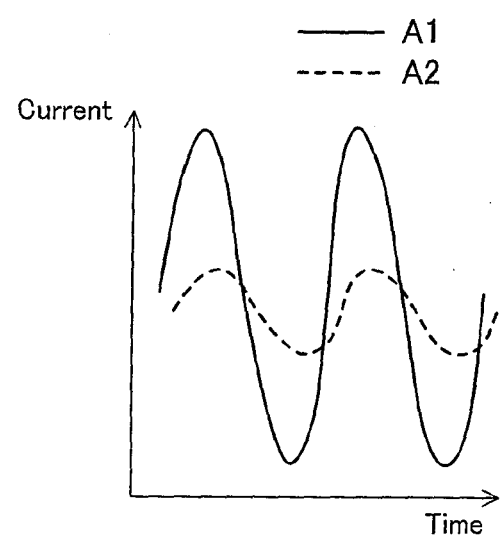

For example, if the first current A1 is greater than the second current A2 when the first and the second drive voltages V1 and V2 having a same effective value of voltage, a same frequency, and different phases as shown in FIG. 12A are applied to the first and the second inter-electrode portions of the actuator body 4, the first inter-electrode portion is more electrically conductive than the second inter-electrode portion. Thus the voltage value of the first drive voltage V1 is adjusted to a higher value (e.g., to a configurable upper limit) as shown in FIG. 17A, thereby adjusting the first current A1 to an even higher value. Note that, if the second current A2 is greater, the second drive voltage V2 is adjusted to a higher value.

That is, one of the first and the second inter-electrode portions is more conductive than the other due to interaction therebetween. In order to increase a driving speed, both the first and the second drive voltages may be adjusted to higher values, but increasing the driving voltage applied to the less conductive inter-electrode portion is not an efficient way. Therefore, as described above, adjusting the drive voltage corresponding to the more electrically conductive one to a higher value allows the driving speed to be efficiently increased. However, from a viewpoint of heat generation in the actuator body 4 and power consumption, it is preferable that the drive voltage be set to a higher value only for a certain limited period of time, for example, a predetermined period during which heat generation in the actuator body 4 is acceptable etc., and that the drive voltage be returned to an original value when the certain period of time has elapsed.

Variations

Whereas, in the aforementioned controls, the drive unit 1 controls the first and the second drive voltages based on the detection results of the first and the second current detectors 12A and 12B, the method is not limited to this. For example, the drive unit 1 may store the first and the second currents which had been measured in advance before shipment etc. or the first and the second drive voltages calculated from the first and the second currents measured in advance in a memory section 18 which is connected to the control section 10 so that signals can be transmitted and received therebetween. Moreover, the drive unit 1 may read the stored data from the memory section 18 when actually operating the ultrasonic actuator 2, and set the first and the second drive voltages based on the data to provide the aforementioned controls.

In addition, instead of storing the first and the second currents upon shipment etc., the drive unit 1 may be configured such that the detection results of the first and the second current detectors 12A and 12B, or the first and the second drive voltages calculated from the detection results may be stored (i.e., learnt) at required timings while actually operating the ultrasonic actuator 2. For example, in a case of the aforementioned current equalization control, if the difference between the current values of the first and the second currents exceeds a predetermined threshold during operation of the ultrasonic actuator 2, the drive unit 1 may adjust the first and the second drive voltages so that the difference falls to or below the threshold, and after this adjustment, store the first and the second drive voltages in the memory section 18, and then use the stored first and second drive voltages when operating afterward. In addition, even when the stored first and second drive voltages are used, the drive unit 1 may monitor the first and the second currents, adjust again the first and the second drive voltages if the difference between the current values of the first and the second currents exceeds the predetermined threshold, then update the stored voltage values in the memory section 18 accordingly.

Advantages of Embodiment

Therefore, according to this embodiment, the actuator body 4 can be operated at drive voltages depending on the first and the second currents by adjusting the first and the second drive voltages so that the voltage values are different from each other, and thus heat generation in the actuator body 4 can be reduced, and the power consumption can also be reduced.

Specifically, if the difference between the current values of the first and the second currents exceeds a predetermined value, adjusting the voltage values of the first and the second drive voltages so that the difference falls to or below the predetermined value prevents a high current from flowing to the actuator body 4, and thus heat generation in the actuator body 4 can be reduced, and the power consumption can also be reduced.

In addition, even if the first and the second currents are not equalized, the drive voltage corresponding to either the first or the second current, which exceeds an upper limit is adjusted to a lower value so that both the first and the second currents are adjusted to less than or equal to the upper limit, and thus heat generation in the actuator body 4 can be reduced, and the power consumption can also be reduced.

Furthermore, if the driving speed has a higher priority than the power consumption, further increasing the drive voltage corresponding to either the first or the second current, whichever has a higher current value, allows high current to efficiently flow to the actuator body 4, and thus the driving speed can be efficiently increased.

Other Embodiments

With respect to the previous embodiment, the following configurations may also be used.

Whereas, in the previous embodiment, the effective values of the first and the second drive voltages are changed by changing the duty cycles of the square-wave voltages, the method is not limited to this. For example, the drive unit may be configured such that the voltage values of the first and the second drive voltages are changed by changing the power-supply voltage by a DC-DC converter.

In addition, the first and the second current detectors 12A and 12B may be connected between the counter electrodes 43 and ground. In such a case, a current value can be determined only with a potential of one side. Alternatively, the first and the second current detectors 12A and 12B may be respectively connected between the first and the second amplifier sections 16A and 16B and the first and the second wave-shaping sections 17A and 17B. In such a case, a current value can be determined with the power-supply voltage and the potential on the side of the wave-shaping section of the resistor. In addition, since the first and the second current detectors 12A and 12B configured with resistors also function as protective resistors for the actuator body 4, sudden heat generation in the actuator body 4 can be prevented even if the actuator body 4 or other members short out. Note that, whereas the first and the second current detectors 12A and 12B are configured with resistors, the configuration is not limited to this; any configuration such as a current transformer, a hall element, etc., may be used as far as current can be detected with that configuration.

Moreover, whereas, in this embodiment, the first and the second drive voltages are adjusted based on the effective values of the first and the second currents flowing through the first and the second inter-electrode portions, the first and the second drive voltages may be adjusted based on, in addition to the first and the second currents, the active currents of the first and the second inter-electrode portions respectively taking into consideration the phases of the first and the second drive voltages.

In this regard, since the output of the ultrasonic actuator 2 may decrease if the drive voltages remain in a condition in which the drive voltages have been adjusted as described previously, it is preferable that the drive voltages be returned to a condition before the adjustment if the current values have fallen below a predetermined threshold for a predetermined period of time. In this case, the drive voltages are not returned to the condition before the adjustment all at once, but the drive voltages are gradually returned in a stepwise fashion, and the drive voltages are adjusted again if the current values exceed a predetermined threshold during a returning process. It is preferable that the predetermined period of time be set to a longer value than the control period of speed control; for example, if the control period of speed control is 10 μs-5 ms, it is preferable to set the predetermined period to 10 ms-10 s.

Furthermore, the shape of the driver elements 8 is not limited to a cylinder. It may be a sphere or a quadrangular prism. If the driver elements 8 are spherical in shape, this is preferable because the driver elements 8 and the actuator body 4 are made contact and fixed in point contact.

The electrical connection members are not limited to flexible cables. For example, wires, contact pins, conductive rubber, etc., may be used. In addition, whereas the configuration of connection using an anisotropic conductive adhesive film has been described, other electric connection methods, such as connection by a low melting-point metal (a solder, etc.), connection by wire bonding, connection by a non-anisotropic conductive adhesive film, connection by a conductive adhesive agent (a liquid adhesive agent, etc.), connection by crimping, etc., may be used. Conductive rubber has, for example, a stacking configuration formed of support layers made primarily of silicone rubber and conductive layers in which silicone rubber and particles of metal such as silver are mixed, and is electrically insulated in the stacking direction, and thus anisotropic. One piece of conductive rubber may be provided or two pieces of conductive rubber may be provided on one side face of the actuator body. If conductive rubber is used, conductive rubber members may be used as the support members 6A and 6C. If one piece of conductive rubber is provided on one side face of the actuator body, it is preferable that electrical insulation between the external power-supply electrode 44 and the external counter electrode 45, electrical insulation between the first and the second external power-supply electrodes 44A and 44B, and electrical insulation between the two external counter electrodes 45 be provided using the insulating properties of the conductive rubber in the stacking direction. In such a case, each conductive layer functions as one of the first power-supply conductive member, the second power-supply conductive member, or the counter conductive members.

The first and the second connection electrodes J1 and J2 are respectively provided in center portions in the longitudinal direction of the corresponding principal faces of the corresponding piezoelectric element layers 41, and have a shape extending in a direction generally parallel to the short sides of the principal faces of the piezoelectric element layers 41; more preferably, in the direction along the long sides of the piezoelectric element layers 41, it is preferable that the widths of the first and the second connection electrodes J1 and J2 be approximately 5%-40% of the length in the direction along the long sides of the piezoelectric element layers 41. This is because too large electrode areas will impede bending vibration of the second-order mode even though higher-amplitude stretching vibration occurs as the electrode areas of the first and the second connection electrodes J1 and J2 increase. Meanwhile, the first and the second connection electrodes J1 and J2 are ideally formed over almost the entire range in the direction along the short sides of the piezoelectric element layers 41, but forming the first and the second connection electrodes J1 and J2 so as to reach edge portions in the lateral direction of the corresponding piezoelectric element layers 41 makes it difficult to provide insulation between the internal electrode layers. Therefore, it is preferable that the first and the second connection electrodes J1 and J2 be formed in regions other than both edge portions in the direction along the short sides of the corresponding principal faces of the corresponding piezoelectric element layers 41. Specifically, it is preferable that the first and the second connection electrodes J1 and J2 be formed over most of the regions other than regions from either edge in the direction along the short sides of the corresponding principal faces of the corresponding piezoelectric element layers 41 to a distance of the length in the thickness direction of the piezoelectric element layers 41 toward the centers in the direction along the short sides.

Although the number of the power-supply electrodes 42 in the first pattern and the number of the power-supply electrodes 42 in the second pattern do not necessarily need to be the same, it is preferable that the numbers be the same. Although the power-supply electrodes 42 in the first pattern and the power-supply electrodes 42 in the second pattern do not necessarily need to be disposed alternately, it is preferable to be disposed alternately. This is because symmetric nature of vibration of the actuator body 4 will improve. This is also because unnecessary vibration will not occur in the actuator body 4, and thus energy loss will be significantly reduced.

Although the electrodes may be formed on principal faces of the actuator body 4, it is preferable that the electrodes not be formed on any principal faces of the actuator body 4. This is because, by not forming the electrodes on any principal faces, which have a largest area of the outer faces of the actuator body 4, a short circuit is less likely to occur even if an electrode contacts a metal part in the vicinity thereof.

Figure 19:
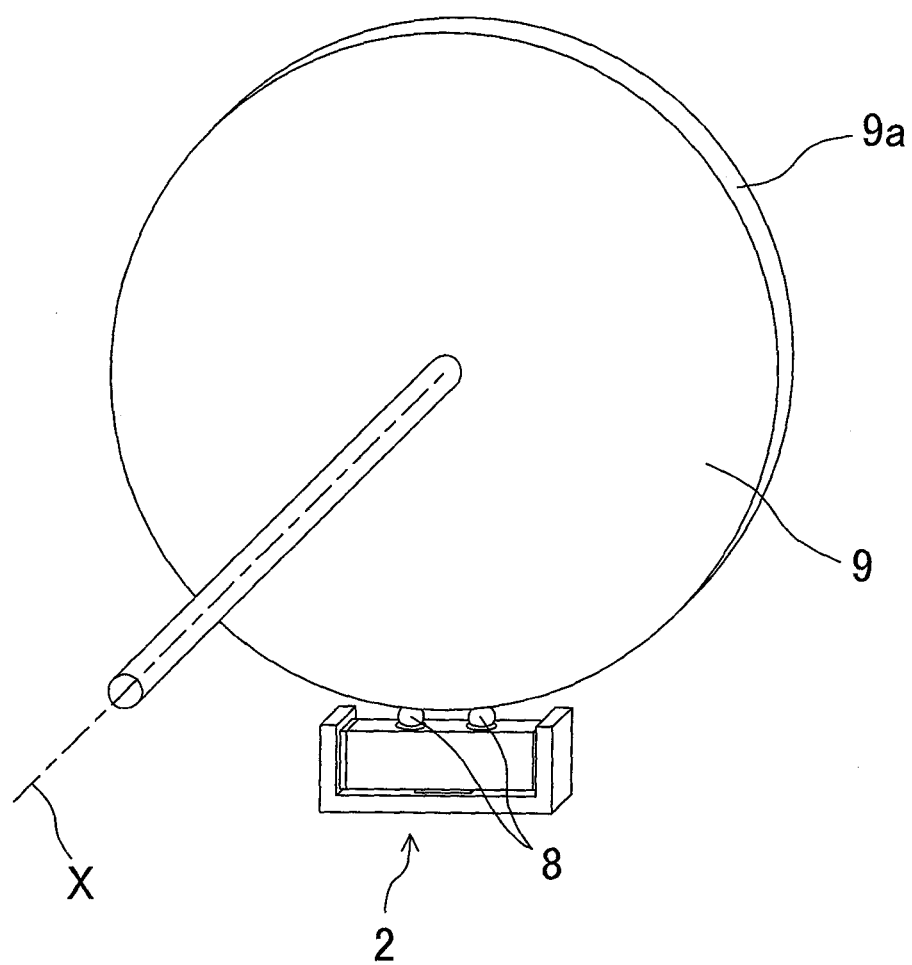
FIG. 19 is a perspective view of a drive unit according to another embodiment.

Whereas, in the previous embodiment, the movable body 9, to which a driving force of the ultrasonic actuator 2 is applied to drive, has a plate-like shape, the configuration is not limited to this, but any configuration may be used as the configuration of the movable body 9. For example, as shown in FIG. 19, the movable body may be a disk 9 rotatable about a predetermined axis X, and may be configured such that the driver elements 8 of the ultrasonic actuator 2 contact a peripheral side surface 9a of the disk 9. In a case of such a configuration, the disk 9 is caused to rotate about the predetermined axis X by generally elliptical movements of the driver elements 8 when the ultrasonic actuator 2 is operated. Alternatively, the ultrasonic actuator 2 may be configured so as to be attached to the movable body, with the driver elements 8 in contact with a fixed body, and to move together with the movable body 9.

Whereas, in the previous embodiment, the support is configured by the case 5, the support may be configured by anything.

It is preferable that the region where the power-supply electrodes 42 and the counter electrodes 43 do not overlap as viewed in the stacking direction be a region from either edge in the longitudinal direction of the piezoelectric element layers 41 to a distance more than or equal to 10% of the length in the longitudinal direction of the piezoelectric element layers 41 toward the center in the longitudinal direction. It is more preferable that the region where the power-supply electrodes 42 and the counter electrodes 43 do not overlap as viewed in the stacking direction be a region from either edge in the longitudinal direction of the piezoelectric element layers 41 to a distance more than or equal to 20% of the length in the longitudinal direction of the piezoelectric element layers 41 toward the center in the longitudinal direction. This is because little stress is generated in the vicinity of each edge in the longitudinal direction of the piezoelectric element layers 41 during stretching vibration of the first-order mode. This is also because an effect on connecting portions between the side faces of the piezoelectric element and the electrical connection members can be reduced.

Whereas, in the previous embodiment, an example has been presented in which the voltage applied to the second power-supply electrodes 42B has a phase shift of approximately +90° or −90° relative to the voltage applied to the first power-supply electrodes 42A, the configuration is not limited to this, but other phase shifts may be applied. In addition, a voltage may be selectively applied to only either the first power-supply electrodes 42A or the second power-supply electrodes 42B.

Figure 20:
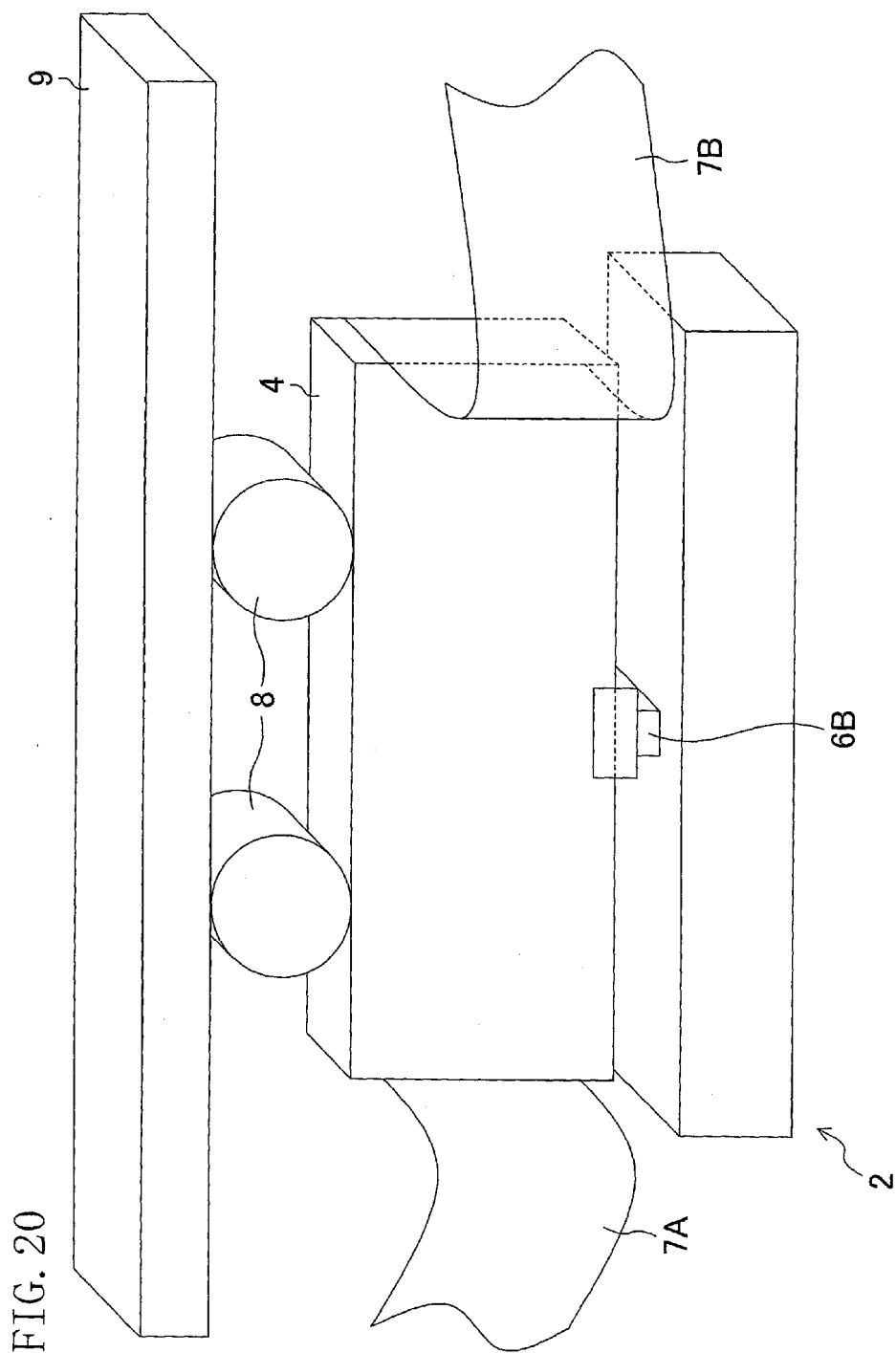
FIG. 20 is a perspective view of a drive unit according to still another embodiment.

Whereas, in the previous embodiment, the ultrasonic actuator 2 is supported using the support members 6A, 6B, and 6C, the method is not limited to this method. For example, as shown in FIG. 20, only the support member 6B may be provided on the end face on which the driver elements are not provided, of the two end faces of the piezoelectric element. The support member 6B regulates movement of the actuator body 4 in the driving direction (direction along the long sides of the principal faces), and allows the actuator body 4 to move in a direction in which the driver elements 8 make contact with the movable body 9 (direction along the short sides of the principal faces). In addition, the support member 6B generates a pressing force in a direction in which the driver elements 8 make contact with the movable body 9, thereby increasing the friction forces between the driver elements 8 and the movable body 9.

Although the actuator body 4, including the piezoelectric element layers, has been described as itself producing stretching vibration and bending vibration in a coordinated manner, a configuration in which a piezoelectric body or the actuator body 4 is attached to a substrate made of metal etc., or a configuration in which a piezoelectric body or the actuator body 4 is interposed in a resonator made of metal etc. may also provide similar advantages. In such cases, the resonator configured including the piezoelectric body constitutes the actuator body, and the resonator is disposed in a case with a compressive force applied in advance.

Although the driver elements 8 have been described as fixed on a longer side face of the actuator body 4, the driver elements 8 may be fixed on a shorter side face.

Although the stretching vibration has been described as of the first order and the bending vibration has been described as of the second order, they may be resonant vibrations of other orders.

It is to be understood that the foregoing embodiments are illustrative in nature, and are not intended to limit the scope of the invention, application of the invention, or use of the invention. The described embodiments are to be considered in all respects only as illustrated and not restrictive. The scope of the invention is, therefore, indicated by the appended claims rather than by the foregoing description. All variations and changes which come within the meaning and range of equivalency of the claims are to be embraced within their scope.

EXAMPLES

Specific examples of adjusting two-phase drive voltages in the ultrasonic actuator 2 will be described below.

Referring as one set to a structure stacked in the order of a piezoelectric element layer 41 on which a power-supply electrode 42 in the first pattern is provided, a piezoelectric element layer 41 on which a counter electrode 43 is provided, a piezoelectric element layer 41 on which a power-supply electrode 42 in the second pattern is provided, and a piezoelectric element layer 41 on which a counter electrode 43 is provided, the actuator body 4 includes five sets, where, of the outermost two piezoelectric element layers 41, the piezoelectric element layer 41 on which an electrode 42 (or 43) is exposed to the ambient has another piezoelectric element layer 41 on which no electrodes are provided stacked thereon. In this way, twenty-one piezoelectric element layers 41 are stacked interposing power-supply electrodes 42 or counter electrodes 43. The piezoelectric element layers 41 are made of lead zirconate titanate. The dimensions of the actuator body 4 having such a configuration is 6.0 mm long (dimension in the longitudinal direction), 1.7 mm wide (dimension in the lateral direction), and 2.0 mm thick (dimension in the thickness direction).

Drive voltages of various voltage patterns as shown below were applied to this actuator body 4.

Tables 1-5 respectively show the parameter values of the first and the second drive voltages V1 and V2 according to the voltage patterns 1-5, as well as the currents flowing to the actuator body 4 and the speed of the movable body 9 associated therewith.

TABLE 1

|  | 1ch | 2ch |
|---|---|---|
| Phase Difference | — | 90° |
| Driving Frequency | 280 kHz | 280 kHz |
| Voltage Value | 4 V | 4 V |
| Current Value | 0.050 A | 0.049 A |
| Driving Speed | 22 mm/s | |

More specifically, in the voltage pattern 1 shown in Table 1, the phase difference between the first and the second drive voltages V1 and V2 is 90°, the frequencies of the first and the second drive voltages V1 and V2 are both 280 kHz, and the effective values of the voltages are both 4 V. Under this condition, the effective value of the first current A1 flowing through the first inter-electrode portion of the actuator body 4 depending on the first drive voltage V1 was 0.050 A, and the effective value of the second current A2 flowing through the second inter-electrode portion of the actuator body 4 depending on the second drive voltage V2 was 0.049 A. The speed of the movable body 9 under this condition was 22 mm/s.

In the voltage pattern 2 shown in Table 2, the frequencies of the first and the second drive voltages V1 and V2 are different from those of the voltage pattern 1.

TABLE 2

|  | 1ch | 2ch |
|---|---|---|
| Phase Difference | — | 90° |
| Driving Frequency | 275 kHz | 275 kHz |
| Voltage Value | 4 V | 4 V |
| Current Value | 0.101 A | 0.085 A |
| Driving Speed | 51 mm/s | |

More specifically, the frequencies of the first and the second drive voltages V1 and V2 are both 275 kHz. Under this condition, the effective value of the first current A1 was 0.101 A, and the effective value of the second current A2 was 0.085 A. The speed of the movable body 9 under this condition was 51 mm/s. In this way, as the parameter values (driving frequencies, in this example) of the first and the second drive voltages change, a proportion between the first and the second currents A1 and A2 also varies.

Thus, the voltage values of the first and the second drive voltages V1 and V2 were adjusted as the voltage pattern 3 shown in Table 3.

TABLE 3

|  | 1ch | 2ch |
|---|---|---|
| Phase Difference | — | 90° |
| Driving Frequency | 275 kHz | 275 kHz |
| Voltage Value | 3.4 V | 4 V |
| Current Value | 0.085 A | 0.085 A |
| Driving Speed | 50 mm/s | |

More specifically, the effective value of the first drive voltage V1 was 3.4 V. The other conditions were the same as those of the voltage pattern 2. The result was that the effective value of the first current A1 corresponding to the first drive voltage V1 was 0.085 A, and the effective value of the second current A2 corresponding to the second drive voltage V2 was 0.085 A. The speed of the movable body 9 under this condition was 50 mm/s. In this way, reducing the effective value of the drive voltage corresponding to the higher current causes the difference between the current values of the first and the second currents A1 and A2 to decrease, thus equalization of both currents can be pursued.

Alternatively, adjustment may be performed so as to increase the voltage value of the drive voltage corresponding to the lower current as the voltage pattern 4 shown in Table 4.

TABLE 4

|  | 1ch | 2ch |
|---|---|---|
| Phase Difference | — | 90° |
| Driving Frequency | 275 kHz | 275 kHz |
| Voltage Value | 4 V | 4.6 V |
| Current Value | 0.101 A | 0.102 A |
| Driving Speed | 58 mm/s | |

More specifically, the effective value of the second drive voltage V2 was 4.6 V. The other conditions were the same as those of the voltage pattern 2. The result was that the effective value of the first current A1 corresponding to the first drive voltage V1 was 0.101 A, and the effective value of the second current A2 corresponding to the second drive voltage V2 was 0.102 A. The speed of the movable body 9 under this condition was 58 mm/s. In this way, increasing the effective value of the drive voltage corresponding to the lower current causes the difference between the current values of the first and the second currents A1 and A2 to decrease, thus equalization of both currents can be pursued.

Moreover, depending on the conditions of the first and the second drive voltages, the first and the second currents may exceed a predetermined upper limit as the voltage pattern 5 shown in Table 5. In such a case, even though the first and the second currents are not equalized, the drive voltages are adjusted so that the first and the second currents are less than or equal to the upper limit as the voltage pattern 6 shown in Table 6.

TABLE 5

|  | 1ch | 2ch |
|---|---|---|
| Phase Difference | — | 90° |
| Driving Frequency | 275 kHz | 275 kHz |
| Voltage Value | 10 V | 10 V |
| Current Value | 0.130 A | 0.105 A |
| Driving Speed | 85 mm/s | |

More specifically, first, the effective values of the first and the second drive voltages V1 and V2 were both 10 V. The other conditions were the same as those of the voltage pattern 2. The result was that the effective value of the first current A1 corresponding to the first drive voltage V1 was 0.130 A, and the effective value of the second current A2 corresponding to the second drive voltage V2 was 0.105 A. The speed of the movable body 9 under this condition was 85 mm/s. Here, the upper limit of the effective values of the first and the second currents is 0.120 A.

TABLE 6

|  | 1ch | 2ch |
|---|---|---|
| Phase Difference | — | 90° |
| Driving Frequency | 275 kHz | 275 kHz |
| Voltage Value | 9.5 V | 10 V |
| Current Value | 0.120 A | 0.105 A |
| Driving Speed | 84 mm/s | |
| Limit Voltage | 0.120 A | |

Therefore, the effective value of the first drive voltage V1 was changed to 9.5 V. The other conditions were unchanged. The result was that the effective value of the first current A1 corresponding to the first drive voltage V1 was 0.120 A, which was the upper limit, and the effective value of the second current A2 corresponding to the second drive voltage V2 was 0.105 A. The speed of the movable body 9 under this condition was 84 mm/s. In this way, reducing the effective value of the drive voltage corresponding to a current whose effective value exceeds the upper limit, of the first and the second currents A1 and A2, prevents the first and the second currents A1 and A2 from exceeding the upper limit, and thus allows reduced power consumption.

Furthermore, if a higher priority needs to be given to the driving speed of the movable body 9 than to power consumption, the driving voltage of the inter-electrode portion having a higher conductivity, of the first and the second inter-electrode portions, is increased temporarily.

TABLE 7

|  | 1ch | 2ch |
|---|---|---|
| Phase Difference | — | 90° |
| Driving Frequency | 275 kHz | 275 kHz |
| Voltage Value | 5 V | 4 V |
| Current Value | 0.120 A | 0.087 A |
| Driving Speed | 70 mm/s | |

More specifically, since the result of the voltage pattern 2 reveals that the first inter-electrode portion, to which the first drive voltage V1 is applied, is more electrically conductive, the effective value of the first drive voltage V1 was set to 5 V in the voltage pattern 6. The other conditions were the same as those of the voltage pattern 2. The result was that the effective value of the first current A1 corresponding to the first drive voltage V1 was 0.120 A, which was the upper limit of acceptable currents, and the effective value of the second current A2 corresponding to the second drive voltage V2 was 0.087 A. In this way, even though the difference between the first and the second currents A1 and A2 widened, the speed of the movable body 9 significantly increased to 70 mm/s. That is, increasing the drive voltage applied to the more conductive inter-electrode portion allows the speed of the movable body 9 to be efficiently increased.

It is to be understood that the invention is not limited to the disclosed examples, but on the contrary, may be embodied in other specific forms without departing from the spirit or essential characteristic thereof. Thus, the described embodiments are to be considered in all respects only as illustrated and not restrictive. The scope of the invention is, therefore, indicated by the appended claims rather than by the foregoing description. All variations and changes which come within the meaning and range of equivalency of the claims are to be embraced within their scope.

What is claimed is:

1. A drive unit, comprising:
a vibratory actuator having an actuator body formed using a piezoelectric element, and configured to output a driving force by inducing vibration in the actuator body,
a control section configured to induce the vibration in the actuator body by applying a first and a second AC voltages having a same frequency and different phases to the piezoelectric element,
a first current detector configured to detect a first current which flows depending on the first AC voltage, and
a second current detector configured to detect a second current which flows depending on the second AC voltage,
wherein
the control section adjusts the first AC voltage and the second AC voltage so that the first AC voltage and the second AC voltage have different voltage values from each other, and
the control section adjusts a voltage value of the first AC voltage and/or a voltage value of the second AC voltage based on detection results of the first and the second current detectors.

2. The drive unit of claim 1, wherein
the control section adjusts the voltage value of the first AC voltage and/or the voltage value of the second AC voltage so that a difference between a current value of the first current and a current value of the second current is less than or equal to a predetermined threshold.

3. The drive unit of claim 2, wherein
the control section reduces the voltage value of the first or the second AC voltage corresponding to either the first or the second current, whichever has a higher current value, so that the difference between the current value of the first current and the current value of the second current is less than or equal to a predetermined threshold.

4. The drive unit of claim 2, wherein
the control section increases the voltage value of the first or the second AC voltage corresponding to either the first or the second current, whichever has a lower current value, so that the difference between the current value of the first current and the current value of the second current is less than or equal to a predetermined threshold.

5. The drive unit of claim 1, wherein
the control section adjusts the voltage value of the first AC voltage and/or the voltage value of the second AC voltage so that the first and the second currents are less than or equal to a predetermined upper limit.

6. The drive unit of claim 1, wherein
the control section adjusts the voltage value of the first AC voltage and/or the voltage value of the second AC voltage so that a current value of either the first or the second current, whichever has a higher current value, is a predetermined upper limit.

7. A drive unit, comprising:
a vibratory actuator having an actuator body formed using a piezoelectric element, and configured to output a driving force by inducing vibration in the actuator body,
a control section configured to induce the vibration in the actuator body by applying a first and a second AC voltages having a same frequency and different phases to the piezoelectric element, and
a memory section configured to store in advance a first current which flows depending on the first AC voltage and a second current which flows depending on the second AC voltage,
wherein
the control section adjusts the first AC voltage and the second AC voltage so that the first AC voltage and the second AC voltage have different voltage values from each other, and
the control section adjusts the voltage value of the first AC voltage and/or the voltage value of the second AC voltage based on the first and the second currents stored in the memory section.

8. The drive unit of claim 7, wherein
the control section adjusts the voltage value of the first AC voltage and/or the voltage value of the second AC voltage so that a difference between a current value of the first current and a current value of the second current is less than or equal to a predetermined threshold.

9. The drive unit of claim 8, wherein
the control section reduces the voltage value of the first or the second AC voltage corresponding to either the first or the second current, whichever has a higher current value, so that the difference between the current value of the first current and the current value of the second current is less than or equal to a predetermined threshold.

10. The drive unit of claim 8, wherein
the control section increases the voltage value of the first or the second AC voltage corresponding to either the first or the second current, whichever has a lower current value, so that the difference between the current value of the first current and the current value of the second current is less than or equal to a predetermined threshold.

11. The drive unit of claim 7, wherein
the control section adjusts the voltage value of the first AC voltage and/or the voltage value of the second AC voltage so that the first and the second currents are less than or equal to a predetermined upper limit.

12. The drive unit of claim 7, wherein
the control section adjusts the voltage value of the first AC voltage and/or the voltage value of the second AC voltage so that a current value of either the first or the second current, whichever has a higher current value, is a predetermined upper limit.

\* \* \* \* \*